(12) United States Patent
Juengling

(10) Patent No.: US 8,877,639 B2
(45) Date of Patent: *Nov. 4, 2014

(54) METHOD AND ALGORITHM FOR RANDOM HALF PITCHED INTERCONNECT LAYOUT WITH CONSTANT SPACING

(75) Inventor: Werner Juengling, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 104 days.

This patent is subject to a terminal disclaimer.

(21) Appl. No.: 13/433,086

(22) Filed: Mar. 28, 2012

(65) Prior Publication Data

US 2012/0184106 A1 Jul. 19, 2012

Related U.S. Application Data

(60) Continuation of application No. 12/906,799, filed on Oct. 18, 2010, now Pat. No. 8,148,247, which is a division of application No. 11/216,613, filed on Aug. 30, 2005, now Pat. No. 7,816,262.

(51) Int. Cl.
| | | |
|---|---|---|
| H01L 21/44 | (2006.01) | |
| H01L 21/033 | (2006.01) | |
| G03F 1/00 | (2012.01) | |
| H01L 21/768 | (2006.01) | |
| H01L 27/02 | (2006.01) | |

(52) U.S. Cl.
CPC ........ H01L 21/0337 (2013.01); H01L 21/0338 (2013.01); G03F 1/144 (2013.01); H01L 21/76816 (2013.01); H01L 27/0207 (2013.01)
USPC .................................. 438/669; 257/E21.038

(58) Field of Classification Search
USPC ................. 438/671, 669, 947; 257/E21.038, 257/E21.039, E21.206, E21.257, E21.576, 257/E21.582; 430/325, 330
See application file for complete search history.

(56) References Cited

U.S. PATENT DOCUMENTS

| | | | |
|---|---|---|---|
| 4,234,362 | A | 11/1980 | Riseman |
| 4,419,809 | A | 12/1983 | Riseman et al. |

(Continued)

FOREIGN PATENT DOCUMENTS

| | | |
|---|---|---|
| DE | 280851 | 7/1990 |
| DE | 42 36 609 A1 | 5/1994 |

(Continued)

OTHER PUBLICATIONS

Bergeron, et al. "Resolution Enhancement Techniques for the 90nm Technology Node and Beyond," Future Fab International, Issue 15, Jul. 11, 2003, 4 pages.

(Continued)

Primary Examiner — Jarrett Stark
(74) Attorney, Agent, or Firm — Knobbe Martens Olson & Bear LLP

(57) ABSTRACT

An embodiment of a system and method produces a random half pitched interconnect layout. A first normal-pitch mask and a second normal-pitch mask are created from a metallization layout having random metal shapes. The lines and spaces of the first mask are printed at normal pitch and then the lines are shrunk to half pitch on mask material. First spacers are used to generate a half pitch dimension along the outside of the lines of the first mask. The mask material outside of the first spacer pattern is partially removed. The spacers are removed and the process is repeated with the second mask. The mask material remains at the locations of first set of spacers and/or the second set of spacers to create a half pitch interconnect mask with constant spaces.

19 Claims, 15 Drawing Sheets

(56) References Cited

U.S. PATENT DOCUMENTS

| | | |
|---|---|---|
| 4,432,132 A | 2/1984 | Kinsbron et al. |
| 4,502,914 A | 3/1985 | Trumpp et al. |
| 4,508,579 A | 4/1985 | Goth et al. |
| 4,570,325 A | 2/1986 | Higuchi |
| 4,648,937 A | 3/1987 | Ogura et al. |
| 4,716,131 A | 12/1987 | Okazawa et al. |
| 4,776,922 A | 10/1988 | Bhattacharyya et al. |
| 4,838,991 A | 6/1989 | Cote et al. |
| 5,013,680 A | 5/1991 | Lowrey et al. |
| 5,047,117 A | 9/1991 | Roberts |
| 5,053,105 A | 10/1991 | Fox, III |
| 5,117,027 A | 5/1992 | Bernhardt et al. |
| 5,328,810 A | 7/1994 | Lowrey et al. |
| 5,330,879 A | 7/1994 | Dennison |
| 5,470,661 A | 11/1995 | Bailey et al. |
| 5,514,885 A | 5/1996 | Myrick |
| 5,563,012 A | 10/1996 | Neisser |
| 5,593,813 A | 1/1997 | Kim |
| 5,670,794 A | 9/1997 | Manning |
| 5,753,546 A | 5/1998 | Koh et al. |
| 5,789,320 A | 8/1998 | Andricacos et al. |
| 5,795,830 A | 8/1998 | Cronin et al. |
| 5,830,332 A | 11/1998 | Babich et al. |
| 5,899,746 A | 5/1999 | Mukai |
| 5,998,256 A | 12/1999 | Juengling |
| 6,004,862 A | 12/1999 | Kim et al. |
| 6,010,946 A | 1/2000 | Hisamune et al. |
| 6,042,998 A | 3/2000 | Brueck et al. |
| 6,057,573 A | 5/2000 | Kirsch et al. |
| 6,063,688 A | 5/2000 | Doyle et al. |
| 6,071,789 A | 6/2000 | Yang et al. |
| 6,110,837 A | 8/2000 | Linliu et al. |
| 6,143,476 A | 11/2000 | Ye et al. |
| 6,207,490 B1 | 3/2001 | Lee |
| 6,211,044 B1 | 4/2001 | Xiang et al. |
| 6,288,454 B1 | 9/2001 | Allman et al. |
| 6,291,334 B1 | 9/2001 | Somekh |
| 6,297,554 B1 | 10/2001 | Lin |
| 6,335,257 B1 | 1/2002 | Tseng |
| 6,348,380 B1 | 2/2002 | Weimer et al. |
| 6,362,057 B1 | 3/2002 | Taylor, Jr. et al. |
| 6,383,907 B1 | 5/2002 | Hasegawa et al. |
| 6,395,613 B1 | 5/2002 | Juengling |
| 6,423,474 B1 | 7/2002 | Holscher |
| 6,455,372 B1 | 9/2002 | Weimer |
| 6,475,867 B1 | 11/2002 | Hui et al. |
| 6,500,756 B1 | 12/2002 | Bell et al. |
| 6,514,884 B2 | 2/2003 | Maeda |
| 6,522,584 B1 | 2/2003 | Chen et al. |
| 6,534,243 B1 | 3/2003 | Templeton et al. |
| 6,548,396 B2 | 4/2003 | Naik et al. |
| 6,559,017 B1 | 5/2003 | Brown et al. |
| 6,566,280 B1 | 5/2003 | Meagley et al. |
| 6,573,030 B1 | 6/2003 | Fairbairn et al. |
| 6,602,779 B1 | 8/2003 | Li et al. |
| 6,632,741 B1 | 10/2003 | Clevenger et al. |
| 6,638,441 B2 | 10/2003 | Chang et al. |
| 6,641,985 B2 | 11/2003 | Unno et al. |
| 6,667,237 B1 | 12/2003 | Metzler |
| 6,673,684 B1 | 1/2004 | Huang et al. |
| 6,686,245 B1 | 2/2004 | Mathew et al. |
| 6,689,695 B1 | 2/2004 | Lui et al. |
| 6,706,571 B1 | 3/2004 | Yu et al. |
| 6,709,807 B2 | 3/2004 | Hallock et al. |
| 6,713,392 B1 | 3/2004 | Ngo et al. |
| 6,734,107 B2 | 5/2004 | Lai et al. |
| 6,737,333 B2 | 5/2004 | Chen et al. |
| 6,744,094 B2 | 6/2004 | Forbes |
| 6,773,998 B1 | 8/2004 | Fisher et al. |
| 6,794,699 B2 | 9/2004 | Bissey et al. |
| 6,800,930 B2 | 10/2004 | Jackson et al. |
| 6,811,954 B1 | 11/2004 | Fukuda |
| 6,835,662 B1 | 12/2004 | Erhardt et al. |
| 6,867,116 B1 | 3/2005 | Chung |
| 6,875,703 B1 | 4/2005 | Furukawa et al. |
| 6,893,972 B2 | 5/2005 | Rottstegger et al. |
| 6,916,594 B2 | 7/2005 | Bok |
| 6,924,191 B2 | 8/2005 | Liu et al. |
| 6,955,961 B1 | 10/2005 | Chung |
| 6,962,867 B2 | 11/2005 | Jackson et al. |
| 7,015,124 B1 | 3/2006 | Fisher et al. |
| 7,074,668 B1 | 7/2006 | Park et al. |
| 7,084,076 B2 | 8/2006 | Park et al. |
| 7,115,525 B2 | 10/2006 | Abatchev et al. |
| 7,151,040 B2 | 12/2006 | Tran et al. |
| 7,183,205 B2 | 2/2007 | Hong |
| 7,183,597 B2 | 2/2007 | Doyle |
| 7,202,174 B1 | 4/2007 | Jung |
| 7,208,379 B2 | 4/2007 | Venugopal et al. |
| 7,253,118 B2 | 8/2007 | Tran et al. |
| 7,268,054 B2 | 9/2007 | Tran et al. |
| 7,271,107 B2 | 9/2007 | Marks et al. |
| 7,288,445 B2 | 10/2007 | Bryant et al. |
| 7,291,560 B2 | 11/2007 | Parascandola et al. |
| 7,393,789 B2 | 7/2008 | Abatchev et al. |
| 7,442,976 B2 | 10/2008 | Juengling |
| 7,456,458 B2 | 11/2008 | Wang |
| 7,537,866 B2 | 5/2009 | King Liu |
| 7,816,262 B2 | 10/2010 | Juengling |
| 7,851,135 B2 | 12/2010 | Jung |
| 7,871,909 B1 | 1/2011 | Wang et al. |
| 8,148,247 B2 | 4/2012 | Juengling |
| 2001/0005631 A1 | 6/2001 | Kim et al. |
| 2002/0042198 A1 | 4/2002 | Bjarnason et al. |
| 2002/0045308 A1 | 4/2002 | Juengling |
| 2002/0063110 A1 | 5/2002 | Cantelle et al. |
| 2002/0068243 A1 | 6/2002 | Hwang et al. |
| 2002/0094688 A1 | 7/2002 | Mitsuiki |
| 2002/0127810 A1 | 9/2002 | Nakamura |
| 2002/0166107 A1 | 11/2002 | Capodieci et al. |
| 2003/0006410 A1 | 1/2003 | Doyle |
| 2003/0044722 A1 | 3/2003 | Hsu et al. |
| 2003/0109102 A1 | 6/2003 | Kujirai et al. |
| 2003/0119307 A1 | 6/2003 | Bekiaris et al. |
| 2003/0127426 A1 | 7/2003 | Chang et al. |
| 2003/0157436 A1 | 8/2003 | Manger et al. |
| 2003/0207207 A1 | 11/2003 | Li |
| 2003/0207584 A1 | 11/2003 | Sivakumar et al. |
| 2003/0215978 A1 | 11/2003 | Maimon et al. |
| 2003/0216050 A1 | 11/2003 | Golz et al. |
| 2003/0230234 A1 | 12/2003 | Nam et al. |
| 2004/0000534 A1 | 1/2004 | Lipinski |
| 2004/0017989 A1 | 1/2004 | So |
| 2004/0018738 A1 | 1/2004 | Liu |
| 2004/0023475 A1 | 2/2004 | Bonser et al. |
| 2004/0023502 A1 | 2/2004 | Tzou et al. |
| 2004/0041189 A1 | 3/2004 | Voshell et al. |
| 2004/0043623 A1 | 3/2004 | Liu et al. |
| 2004/0053475 A1 | 3/2004 | Sharma |
| 2004/0079988 A1 | 4/2004 | Harari |
| 2004/0106257 A1 | 6/2004 | Okamura et al. |
| 2004/0235255 A1 | 11/2004 | Tanaka et al. |
| 2005/0074949 A1 | 4/2005 | Jung et al. |
| 2005/0112886 A1 | 5/2005 | Asakawa et al. |
| 2005/0142497 A1 | 6/2005 | Ryou |
| 2005/0151206 A1 | 7/2005 | Schwerin |
| 2005/0153562 A1 | 7/2005 | Furukawa et al. |
| 2005/0164454 A1 | 7/2005 | Leslie |
| 2005/0167394 A1 | 8/2005 | Liu et al. |
| 2005/0186705 A1 | 8/2005 | Jackson et al. |
| 2005/0272259 A1 | 12/2005 | Hong |
| 2006/0003182 A1 | 1/2006 | Lane et al. |
| 2006/0011947 A1 | 1/2006 | Juengling |
| 2006/0022248 A1 | 2/2006 | Fischer et al. |
| 2006/0024940 A1 | 2/2006 | Furukawa et al. |
| 2006/0024945 A1 | 2/2006 | Kim et al. |
| 2006/0046161 A1 | 3/2006 | Yin et al. |
| 2006/0046200 A1 | 3/2006 | Abatchev et al. |
| 2006/0046201 A1 | 3/2006 | Sandhu et al. |
| 2006/0046422 A1 | 3/2006 | Tran et al. |
| 2006/0046484 A1 | 3/2006 | Abatchev et al. |
| 2006/0083996 A1 | 4/2006 | Kim |
| 2006/0115978 A1 | 6/2006 | Specht |
| 2006/0172540 A1 | 8/2006 | Marks et al. |

(56) References Cited

U.S. PATENT DOCUMENTS

| | | |
|---|---|---|
| 2006/0189150 A1 | 8/2006 | Jung |
| 2006/0211260 A1 | 9/2006 | Tran et al. |
| 2006/0216923 A1 | 9/2006 | Tran et al. |
| 2006/0231900 A1 | 10/2006 | Lee et al. |
| 2006/0234138 A1 | 10/2006 | Fehlhaber et al. |
| 2006/0250593 A1 | 11/2006 | Nishii |
| 2006/0263699 A1 | 11/2006 | Abatchev et al. |
| 2006/0267075 A1 | 11/2006 | Sandhu et al. |
| 2006/0273456 A1 | 12/2006 | Sant et al. |
| 2006/0281266 A1 | 12/2006 | Wells |
| 2007/0018345 A1 | 1/2007 | Chao |
| 2007/0026672 A1 | 2/2007 | Tang et al. |
| 2007/0045712 A1 | 3/2007 | Haller et al. |
| 2007/0048674 A1 | 3/2007 | Wells |
| 2007/0049011 A1 | 3/2007 | Tran |
| 2007/0049030 A1 | 3/2007 | Sandhu et al. |
| 2007/0049032 A1 | 3/2007 | Abatchev et al. |
| 2007/0049035 A1 | 3/2007 | Tran |
| 2007/0049040 A1 | 3/2007 | Bai et al. |
| 2007/0050748 A1 | 3/2007 | Juengling |
| 2007/0077524 A1 | 4/2007 | Koh |
| 2007/0200178 A1 | 8/2007 | Yun et al. |
| 2007/0210449 A1 | 9/2007 | Caspary et al. |
| 2007/0215874 A1 | 9/2007 | Furukawa et al. |
| 2007/0215960 A1 | 9/2007 | Zhu et al. |
| 2007/0275309 A1 | 11/2007 | Liu |
| 2008/0054350 A1 | 3/2008 | Breitwisch et al. |
| 2008/0090419 A1 | 4/2008 | Koh et al. |
| 2008/0292991 A1 | 11/2008 | Wallow |

FOREIGN PATENT DOCUMENTS

| | | |
|---|---|---|
| EP | 0227303 | 7/1987 |
| EP | 0491408 | 6/1992 |
| EP | 1357433 | 10/2003 |
| JP | 57-048237 | 3/1982 |
| JP | 05343370 | 12/1993 |
| JP | H08-55908 | 2/1996 |
| JP | H08-55920 | 2/1996 |
| JP | 2004-152784 | 5/2004 |
| KR | 10-1999-0001440 | 1/1999 |
| KR | 10-1999-027887 | 4/1999 |
| WO | WO 94/15261 | 7/1994 |
| WO | WO 02/099864 A1 | 12/2002 |
| WO | WO 04/001799 A2 | 12/2003 |
| WO | WO 2004/003977 | 1/2004 |
| WO | WO 2005/010973 | 2/2005 |
| WO | WO 2005/034215 A1 | 4/2005 |
| WO | WO 2006/026699 | 3/2006 |

OTHER PUBLICATIONS

Bhave et al., "Developer-soluble Gap fill materials for patterning metal trenches in Via-first Dual Damascene process," preprint of Proceedings of SPIE: Advances in Resist Technology and Processing XXI, vol. 5376, John L. Sturtevant, editor, 2004, 8 pages.

Bruek, "Optical and Interferometric Lithography—Nanotechnology Enablers," 2005, Proceedings of the IEEE, vol. 93, No. 10, pp. 1704-1721.

Choi et al. "Sublithographic nanofabrication technology for nanocatalysts and DNA chips," *J. Vac. Sci. Technol.*, Nov./Dec. 2003; pp. 2951-2955.

Chung et al. "Nanoscale Multi-Line Patterning Using Sidewall Structure," Jpn., J. App.. Phys. vol. 41 (2002) Pt. 1, No. 6B, pp. 4410-4414.

Chung et al. "Pattern multiplication method and the uniformity of nanoscale multiple lines," J.Vac.Sci.Technol. B21(4), Jul./Aug. 2003, pp. 1491-1495.

U.S. Appl. No. 11/543,515, filed Oct. 24, 2006.

*Ex parte Cantell*, unpublished decision of the Board of Patent Appeals and Interferences, Mar. 4, 2005.

Joubert et al. "Nanometer scale linewidth control during etching of polysilicon gates in high-density plasmas," Microelectronic Engineering 69 (2003), pp. 350-357.

Oehrlein et al., "Pattern transfer into low dielectric materials by high-density plasma etching," Solid State Tech., May 2000, 8 pages.

Office Action of May 15, 2008 in U.S. Appl. No. 11/492,513, filed Jul. 24, 2006.

Office Action of Jun. 2, 2008 in U.S. Appl. No. 11/219,067, filed Sep. 1, 2005.

Office Action of Jun. 3, 2008 in U.S. Appl. No. 11/492,323, filed Jul. 24, 2006.

Office Action of Jun. 5, 2008 in U.S. Appl. No. 11/514,117, filed Aug. 30, 2006.

Office Action of Jul. 11, 2008 in U.S. Appl. No. 11/367,020, filed Mar. 2, 2006.

Office Action of Feb. 26, 2008 in U.S. Appl. No. 11/366,212, filed Mar. 2, 2006.

PCT International Search Report and Written Opinion, PCT Application No. PCT/US2008/081380 filed Oct. 27, 2008, Mar. 17, 2009.

Sheats et al., "Microlithography: Science and Technology," 1998, Marcel Dekkar, Inc., pp. 104-105.

Hardmask Thickness 5

| Etch Area / Etch Amount | | First Mask Spacer  0 | First Mask Inside Spacer  4 | First Mask Outside Spacer/Line Pattern  2 |
|---|---|---|---|---|
| Second Mask Spacer | 0 | 5 | 1 | 3 |
| Second Mask Inside Spacer | 4 | 1 | −3 | −1 |
| Second Mask Outside Spacer/Line Pattern | 2 | 3 | −1 | 1 |

FIG. 24

METHOD AND ALGORITHM FOR RANDOM HALF PITCHED INTERCONNECT LAYOUT WITH CONSTANT SPACING

PRIORITY APPLICATION

This application is a continuation of U.S. patent application Ser. No. 12/906,799, filed Oct. 18, 2010 (U.S. Pat. No. 8,148,247) which is a divisional of U.S. patent application Ser. No. 11/216,613, filed Aug. 30, 2005 (U.S. Pat. No. 7,816,262) which are hereby incorporated by reference in their entireties herein.

BACKGROUND OF THE INVENTION

1. Field of the Invention

The invention relates generally to semiconductor devices and particularly to systems and methods of forming interconnect layouts for semiconductor devices.

2. Description of the Related Art

A semiconductor device includes many electronic components, such as transistors, resistors, or diodes, for example. A metallized interconnect layer interconnects the electronic components to form larger circuit components such as gates, cells, memory units, arithmetic units, controllers, or decoders, for example, on the semiconductor device.

To form the interconnect layer, in one implementation, a layer of metal is deposited on the semiconductor device. A photolithographic masking process is then performed to mask off the areas where the metal should remain, according to an interconnect layout. Then, a metal etch is performed to remove the excess metal. This leaves the metallization contacting those areas of the semiconductor device required by design.

To form the mask used in the photolithographic masking process, a photosensitive film is deposited on a layer of hardmask. An optical image of the interconnect layout is transferred to the photoresist by projecting a form of radiation, typically ultraviolet radiation, through the transparent portions of a mask plate or reticle. A photochemical reaction alters the solubility of the regions of the photoresist exposed to the radiation. The photoresist is washed with a solvent known as developer to preferentially remove the regions of higher solubility, followed by curing the remaining regions of the photoresist. Those remaining regions of the photoresist are highly resistant to attack by an etching agent that is capable of removing the hardmask. The portions of the hardmask exposed by the removal of the photoresist are etched away to define the patterned hardmask. Portions of the metal layer exposed by the removal of the hardmask are then etched away to define the metallization interconnect layer.

Semiconductor device designers often desire to increase the level of integration or density of elements within the semiconductor device by reducing the separation distance between neighboring elements, and thus, between interconnect lines.

Unfortunately, the minimum lateral dimension that can be achieved for a patterned photoresist feature is limited by, among other things, the resolution of the optical system used to project the image onto the photoresist. The term "resolution" describes the ability of an optical system to distinguish closely spaced objects.

Processes using pitch multiplication can be used to reduce the minimum printable feature of a photoresist mask, when the mask consists of an array of parallel lines. However, it is difficult to achieve this for metallization masks comprising random shapes. It is also difficult control a constant spacing between the metal nodes of the interconnect layer comprising random shapes since spacers can only be defined around a resist feature.

SUMMARY OF THE INVENTION

In an embodiment, two normal pitched masks are generated from a half pitched design of an interconnect layout having random shapes. The conductor areas or shapes of the interconnect layout are divided into four groups or designations (m1, m2, m3, m4) using the rule that shapes of the same designation cannot be next to each other. Two reticles are generated from the layout. Each reticle uses two of the four designated shapes such that one designation is common to both reticles, one designation is not used in either reticle, and each reticle uses one designation not used in the other reticle. The shapes are sized by 0.5 F to become printable shapes, and the spaces shrink by 0.5 F. In an embodiment, the spaces are larger than 1.5 F due to the rule that two shapes of the same designation cannot be next to each other.

In an embodiment, a method of creating two normal pitch masks from a half pitched interconnect layout comprises generating a half pitched interconnect layout comprising shapes, and designating each shape one of a first designation, a second designation, a third designation and a fourth designation such that shapes of the same designation are not adjacent. The method further comprises creating a first mask containing shapes having any two of the first, second, third, and fourth designations, and creating a second mask containing shapes having any one of the designations included in the first mask and any one of the designations not included in the first mask.

In an embodiment, two normal pitched masks comprising random shapes are used to generate an interconnect mask having half pitched features. The interconnect mask can be used to produce an interconnect layer on a semiconductor device comprising a layer of hardmask. The line/space pattern of a first mask is printed on a semiconductor device at the normal pitch, where the normal feature size of the lines is F and the normal feature size of the gaps is F. The lines are isotropically etched to shrink the size by 0.5 F. The gaps grow to 1.5 F. The line is etched into a layer of the semiconductor device. Spacers are then deposited at the outside of each line. The line is removed and the spacer pattern is transferred to the hardmask by etching. The hardmask is etched such that the thickness of the hardmask not covered by a spacer is reduced by half of the original thickness. This process is repeated using a second mask. The hard mask is removed in areas that were not covered by the spacer pattern of either the first or the second mask. The remaining hardmask forms a pattern for the formation of an interconnect layer having constant spacing between nodes.

In an embodiment, a method of forming an interconnect mask comprises applying a first mask to a semiconductor device comprising a hardmask layer having a thickness, forming over the hardmask layer first spacers outside of first lines associated with the first mask, and removing approximately half of the thickness of the hardmask not covered by the first spacers to form a patterned hardmask. The method further comprises applying a second mask to the semiconductor device over the patterned hardmask, forming over the patterned hardmask second spacers outside of second lines associated with the second mask, and removing approximately half of the thickness of the patterned hardmask not covered by the second spacers.

In another embodiment, two normal pitched masks are created from a half pitched interconnect layout comprising semi-random shapes and a non-conductor periphery. The conductor areas or shapes of the interconnect layout are divided into three groups or designations (m1, m2, m3), and the non-conductor periphery of the layout is assigned a fourth designation (m4). The shapes are designated are designated using the rule that shapes having the same designation cannot be next to each other. If this is not possible, dummy shapes designated as m4 are introduced such that no two adjacent shapes have the same designation. Two reticles are generated from the layout. Each reticle uses two of the four designations such that one designation is common to both reticles, the m4 designation is not used in either reticle, and each reticle uses one designation not used by the other. The shapes are sized by 0.5 F to become printable shapes, and the gaps shrink by 0.5 F. In an embodiment, the gaps are larger than 1.5 F due to the rule that two shapes of the same designation cannot be next to each other.

In an embodiment, a method of creating two normal pitch masks from a half pitch interconnect layout comprises generating an interconnect layout comprising shapes and a periphery, assigning each shape one of a first designation, a second designation, and a third designation, and assigning the periphery a fourth designation. The method further comprises introducing separators into the interconnect layout such that shapes having the same designation are not adjacent, wherein the separators are assigned the fourth designation, creating a first mask containing the shapes having any two of the first, second, and third designations, and creating a second mask containing shapes having any one of the first, second, and third designations contained in the first mask and any one of the first, second, and third designations not included in the first mask.

In an embodiment, two normal pitched masks having semi-random shapes and a non-conductor periphery are used to generate an interconnect mask having half pitched features. The interconnect mask can be used to produce an interconnect layer on a semiconductor device having a layer of hardmask. The line/space pattern of a first mask is printed on a semiconductor device at the normal pitch, where the normal feature size of the lines is F and the normal feature size of the gaps is F. The line is isotropically etched to shrink the size by 0.5 F. The gaps grow to 1.5 F. The line is etched into a layer of the semiconductor device. Spacers are deposited at the outside of each line. The material outside the spacer/line pattern is removed and an over etch by a first amount is etched into the hardmask. The line is removed and an over etch of a second amount is etched into the hardmask. The spacers are removed.

The area of the hardmask covered by the spacers is unchanged. The height of the hardmask outside the spacers is reduced by the amount of the first over etch. The height of the hardmask inside the spacers is reduced by the amount of the second over etch.

The process is repeated with a second mask. Depending on the thickness of the hardmask and the amounts of the first and second over etches, the amount of hardmask remaining on the semiconductor can be controlled. The remaining hardmask forms a pattern for the formation of an interconnect layer having constant spacing between nodes.

In an embodiment, a method of forming an interconnect mask comprises applying a first mask to a semiconductor device comprising a layer of a hardmask, forming over the hardmask first spacers beside first lines associated with the first mask to form a first spacer/line pattern, and removing a first amount of the hardmask outside the first spacer/line pattern and removing a second amount of the hardmask inside the first spacers to form a patterned hardmask. The method further comprises applying a second mask to the patterned hardmask, forming over the patterned hardmask second spacers beside second lines associated with the second mask to form a second spacer/line pattern, and removing a third amount of the hardmask outside the second spacer/line pattern and removing a fourth amount of the hardmask inside the second spacers.

For purposes of summarizing the invention, certain aspects, advantages, and novel features of the invention have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

A general architecture that implements the various features of the invention will now be described with reference to the drawings. The drawings and the associated descriptions are provided to illustrate embodiments of the invention and not to limit the scope of the invention. Throughout the drawings, reference numbers are re-used to indicate correspondence between referenced elements. In addition, the first digit of each reference number indicates the figure in which the element first appears.

FIG. 24 is a table having exemplary values for the thickness of the hardmask, the first etch amount, and the second etch amount, which illustrates how the thickness of the hardmask and the first and second etch amounts may control the formation of the interconnect mask in an embodiment.

DETAILED DESCRIPTION OF THE PREFERRED EMBODIMENT

Figure 1:
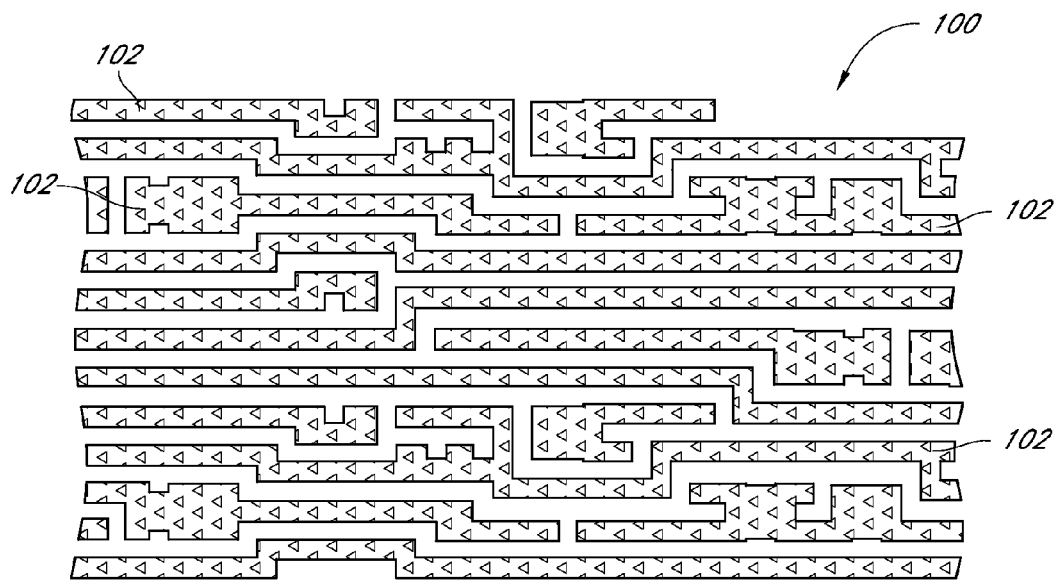
FIG. 1 illustrates a top plan view of an exemplary embodiment of a half pitched interconnect layout comprising random shapes.

For a more detailed understanding of the invention, reference is first made to FIG. 1. FIG. 1 illustrates a top plan view of an exemplary embodiment of a half pitched interconnect layout 100 comprising random shapes 102. This layout 100 represents a desired pattern of conductive traces to be formed on the semi-conductor circuit. The half pitched interconnect layout 100 cannot be used directly to form a mask used in a photolithographic process to create an interconnect layer because the pitch is smaller than the minimum printable feature of a mask, where F is defined as the minimum printable size. It is understood that, due to the limitations of photolithography, there is a minimum distance at which the photoresist cannot be exposed. A normal pitch is defined as having a size of F, and a half pitch is defined as having a size of 0.5 F.

In order to print the features of the interconnect layout 100 photolithographically on a semiconductor device, two normal pitched masks are generated from the interconnect layout 100. These two normal pitch masks are then used to construct an interconnect structure having a pitch that is less than the minimum pitch F.

Figure 2:
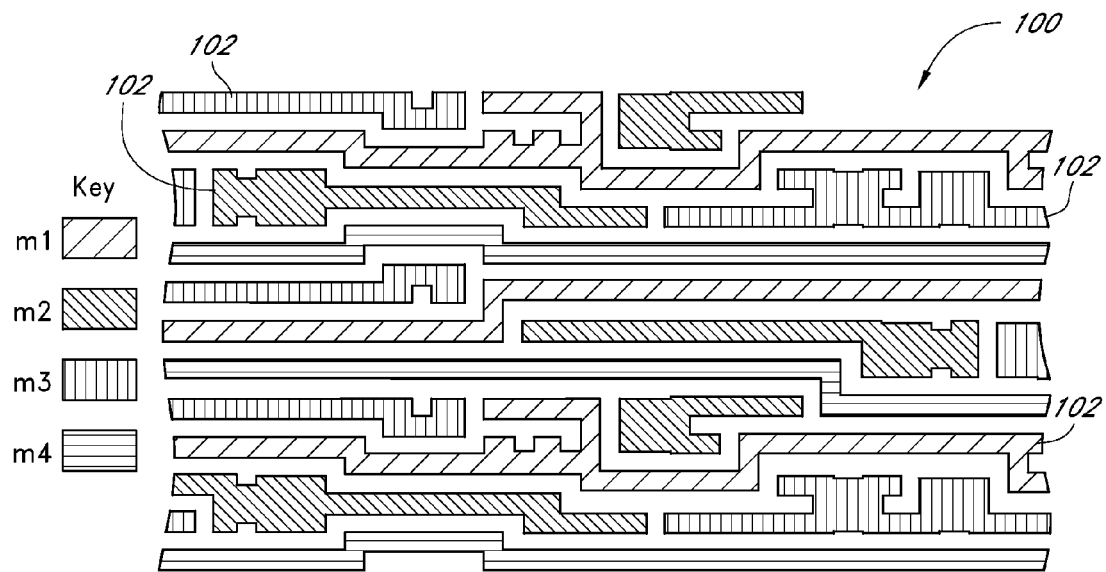
FIG. 2 illustrates a top plan view of an embodiment of the half pitched interconnect layout of FIG. 1 partitioned into four designations, m1, m2, m3, and m4.

FIG. 2 illustrates the half pitched layout 100 of FIG. 1 where the random shapes 102 have been labeled m1, m2, m3, or m4. In this particular implementation, the shapes, m1, m2, m3, m4, are labeled such that no shapes of the same designation can be next to each other.

In the embodiment illustrated in FIG. 2, the shapes 102 designated as m1 are indicated by a right slanted 45° hatching. The shapes 102 designated as m2 are indicated by a left slanted 45° hatching. The shapes 102 designated as m3 are indicated by vertical lines, and the shapes 102 designated as m4 are indicated by horizontal lines.

Figure 3:
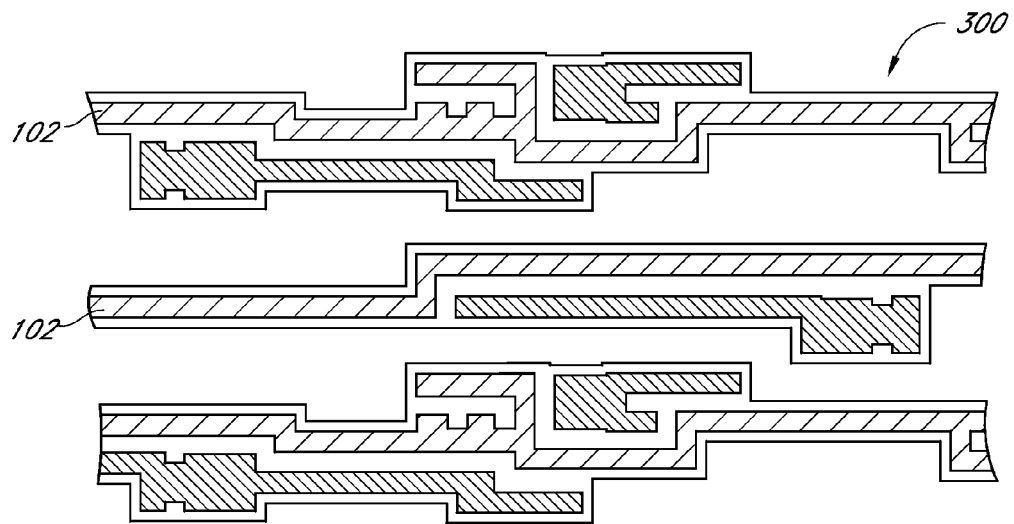
FIG. 3 illustrates a top plan view of an embodiment of a first mask to be applied to a semiconductor device where the mask includes two of the four designations.

A first mask 300 is generated using any two of the designations m1, m2, m3, m4 of the shapes 102. FIG. 3 illustrates a top plan view of an embodiment of a first mask 300 to be applied to a semiconductor device. The mask 300 includes shapes 102 having two of the four designations. The embodiment illustrated in FIG. 3 includes the shapes 102 designated as m1 and m2. The shapes 102 are sized by 0.5 F, and thus printable by a photolithographic process.

In other embodiments, the first mask 300 may consist of other permutations of two designations of shapes 102 from the group of four designations, such as, for example, m1 and m3, m1 and m4, m2 and m3, m2 and m4, or m3 and m4.

Figure 4:
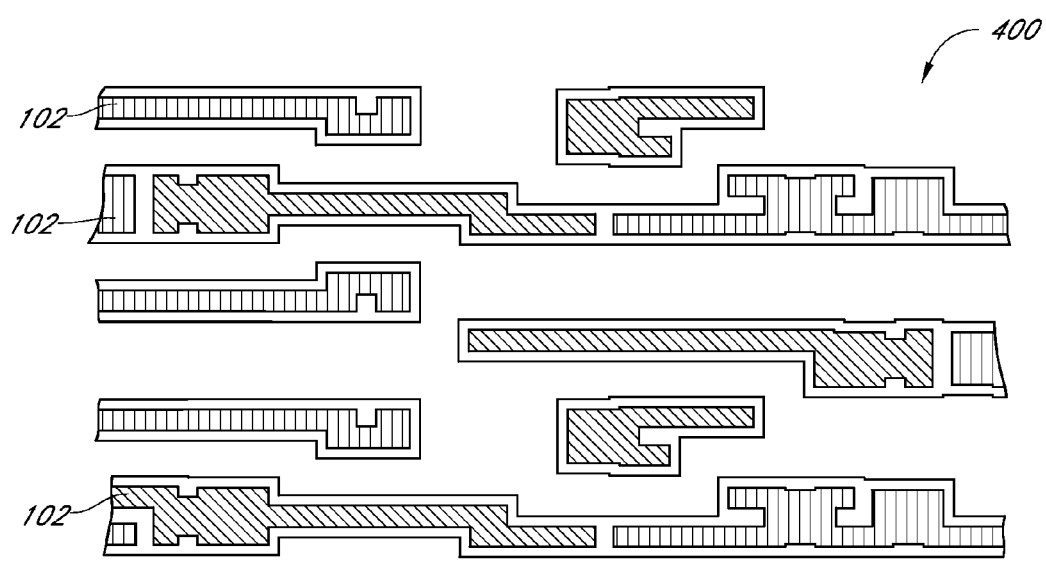
FIG. 4 illustrates a top plan view of an embodiment of a second mask to be applied to a semiconductor device, where the mask includes one designation which is common to the first mask and one designation which is excluded from first mask.

A second mask is generated using two of the designations m1, m2, m3, m4 of the shapes 102, such that one designation which is common to the designations chosen for the first mask 300 and one designation which is excluded from the designations chosen for the first mask 300, are selected. FIG. 4 illustrates a top plan view of an embodiment of a second mask 400 to be applied to a semiconductor device. The mask 400 includes shapes of one designation, which are common to the first mask 300, and shapes of another designation, which are excluded from the first mask 300. The embodiment illustrated in FIG. 4 includes the shapes having the designations m2 and m3. The shapes 102 are sized by 0.5 F, and thus printable by a photolithographic process.

In the embodiment illustrated in FIGS. 3 and 4, both the first mask 300 and the second mask 400 include the shapes 102 designated as m2. The first mask further includes the shapes 102 designated as m1, and excludes the shapes 102 designated as m3 and m4. The second mask 400 further includes the shapes 102 designated as m3 and excludes the shapes 102 designated as m1 and m4. Neither mask 300, 400 includes the shapes designated as m4.

Applying the rule that one of the designations selected for use in the second mask 400 is the same and one of the designations selected for use in the second mask 400 is different from the designations selected in the first mask 300 results in other possible selections. For example, in the embodiment illustrated in FIGS. 3 and 4, other embodiments of the mask 400 may include the shapes designated as m2 and m4, m1 and m3, or m1 and m4. These designations also fit the rule that one of the designations selected in the second mask 400 is the same and one is different from the designations selected in the first mask 300. In other embodiments, other designations of the metal shapes for the second mask 400 may also be selected, depending on the designations selected for the first mask 300.

Figure 5:
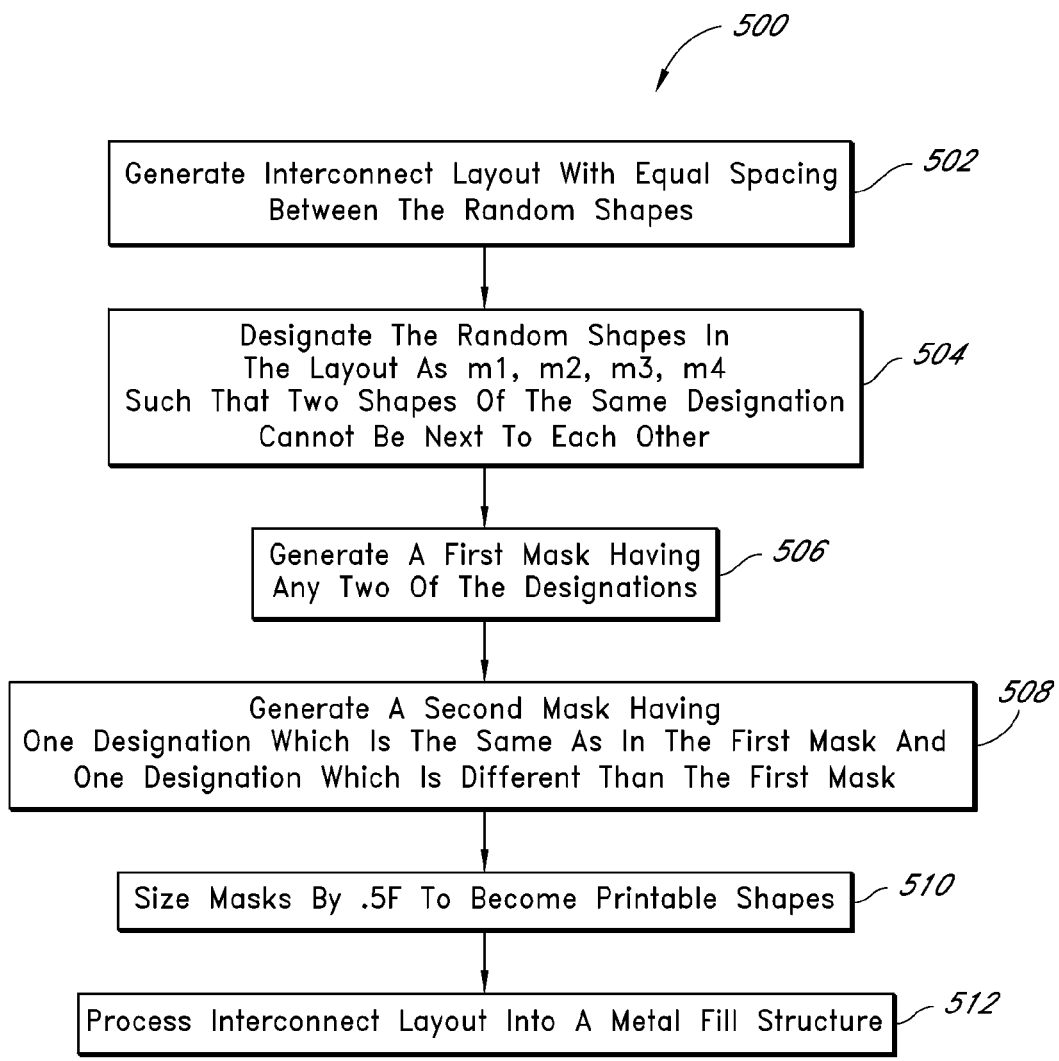
FIG. 5 illustrates a flow chart of an embodiment of the process to produce two standard pitch masks from a half pitched interconnect layout comprising random shapes.

FIG. 5 illustrates a flow chart of an embodiment of a process 500 to produce two standard pitch masks from a half pitched layout 100 comprising random shapes 102. In an embodiment, the process 500 is alignment sensitive and the alignment error should be less than 0.25 F.

In block 502, the desired half pitched interconnect layout 100 is generated. In an embodiment, the layout is a metallization layout with constant spacing between conductive nodes. In an embodiment, the layout is a metal fill reticle having constant spacing between the random shapes to allow double pitching.

The random shapes 102 are designated as m1, m2, m3, or m4 such that two shapes 102 of the same designation, m1, m2, m3, m4, are not next to each other in block 504. By analogy, the designation process can be likened to a map of the United States, where each of the 50 states is colored one of four colors. In order to easily view the states on the map, the color of each state is chosen such that no adjacent states have the same color.

In block 506, the layout of the first mask 300 is generated using any two of the four designations, m1, m2, m3, m4.

In block 508, the layout of the second mask 400 is generated using one of the designations chosen in the first mask 300 and one of the designations not chosen in the first mask 300. One of the designations m1, m2, m3, m4 is not used in either the first mask 300 or the second mask 400. In the illustrated embodiment, the designations m1 and m2 are chosen for the first mask 300, the designations m2 and m3 are chosen for the second mask 400, and the designation m4 is not chosen for either mask 300, 400.

In block 510, in order to be used in the photolithographic process, the shapes 102 in the masks 300, 400, respectively, are sized by 0.5 F to become printable shapes.

The layouts for the masks 300, 400 are each processed into a metal fill structure in block 512. In an embodiment, the metal fill structure is a dense fill structure.

Figure 6:
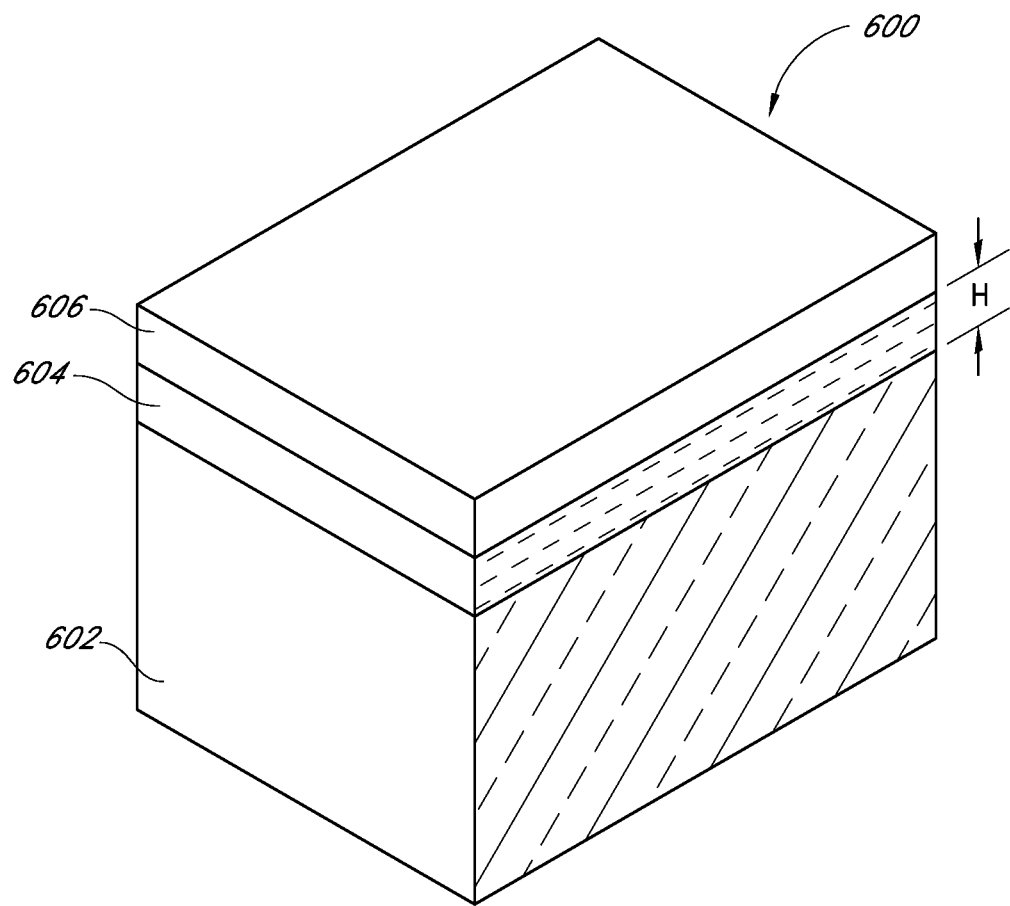
FIG. 6 illustrates a perspective view of an embodiment of a semiconductor device after the formation of additional semiconductor processing layers in which an interconnect layer can be formed. Views taken along line A-A show a cross-section of the semiconductor device.

FIG. 6 illustrates a perspective view of an embodiment of a semiconductor device 600 in which a mask corresponding to the interconnect layout 100 can be formed using the masks 300, 400. Views taken along line A-A show a cross-section of the semiconductor device 600.

The semiconductor device 600 comprises a semiconductor substrate 602, which may comprise a variety of suitable materials. The semiconductor substrate 602 may include semiconductor structures and/or other layers that have been fabricated thereon, an intrinsically doped monocrystalline silicon wafer, or any doped silicon platform that is commonly used in the art. Those of ordinary skill in the art will understand that the semiconductor substrate 602 in other arrangements can comprise other forms of semiconductor layers, which include other active or operable portions of semiconductor devices.

The semiconductor device 600 further comprises a layer of material 604 formed over semiconductor substrate 602 and suitable to be used as a hardmask, in accordance with an embodiment of the invention. In a preferred embodiment, the hardmask 604 comprises amorphous carbon. In other embodiments, the hardmask 604 can comprise tetraethylorthosilicate (TEOS), polycrystalline silicon, $Si_3N_4$, $SiO_3N_4$, SiC, or any other suitable hardmask material. The material 604 can be deposited using any suitable deposition process, such as, for example, chemical vapor deposition (CVD) or physical vapor deposition (PVD). In an embodiment, the thickness H of the hardmask 604 is preferably within the range of about 500 Å to about 3,000 Å and more preferably within the range of about 1,000 Å to about 3,000 Å.

A first layer of a material 606 is deposited over the hardmask 604. Preferably, the material 606 can be etched selectively with respect to the hardmask 604 and the silicon 602, and the hardmask 604 and the silicon 602 can be selectively etched with respect to the material 606. In an embodiment, the material 606 can comprise, for example, Tetraethyl Orthosilicate (TEOS), having a thickness preferably within the range of about 100 Å to about 500 Å and more preferably within the range of about 300 Å to about 300 Å. The material 606 can be deposited using any suitable deposition process, such as, for example, chemical vapor deposition (CVD) or physical vapor deposition (PVD).

Figure 7:
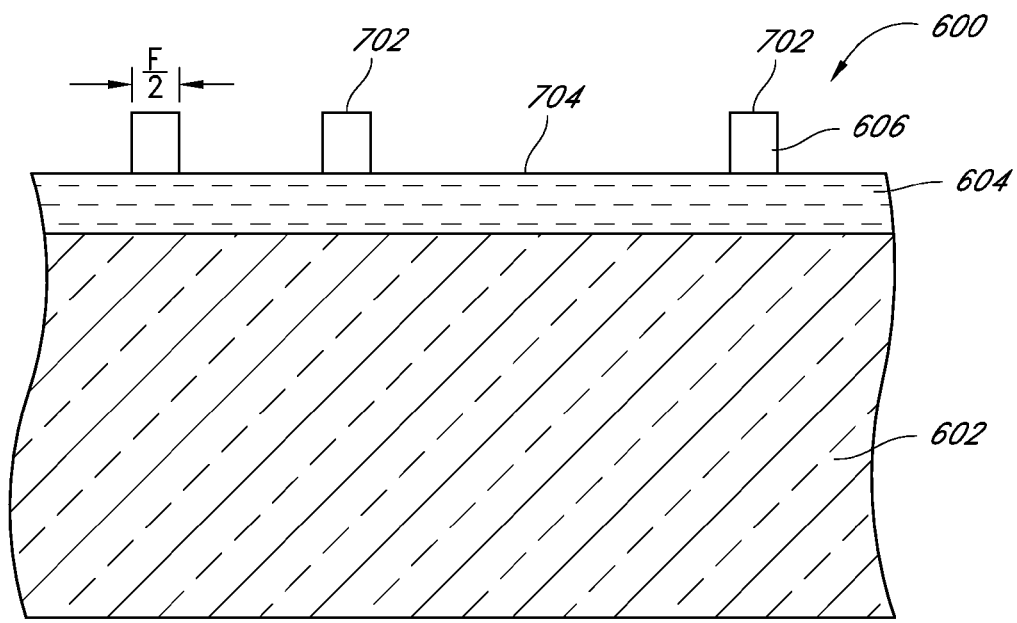
FIG. 7 illustrates a cross-sectional view taken along line A-A of an embodiment of the device of FIG. 6 after printing, shrinking, and etching the pattern from the mask of FIG. 3.

FIG. 7 illustrates a cross-sectional view taken along line A-A of an embodiment of the semiconductor device 600 of FIG. 6 after applying the photo mask 300 (FIG. 3) and patterning the first layer of the material 606.

The material 606 can be patterned using well-known photolithography and etching techniques. For example, in some embodiments, photoresist is deposited as a blanket layer over the device 600 and exposed to radiation through a reticle. Following this exposure, the photoresist film is developed to form the photoresist mask 300 (FIG. 3) on the surface of the material 606, and the material 606 is etched through the mask 300 to expose the hardmask 604 of the device 600 in gaps 704.

In some embodiments, the material 606 is etched using a process such as, for example, ion milling, reactive ion etching (RIE), or chemical etching. If an etching process involving a chemical etchant (including RIE) is selected, any of a variety of well-known etchants can be used, such as for example, $CF_4$.

As illustrated in FIG. 7, the material 606 remains over areas of the hardmask 604 where the mask 300 forms lines 702. The material 606 is removed, however, from the area over the hardmask 604 where the mask 300 forms the gaps 704. In the illustrated embodiment, features of the material 606 or the prior photo mask 300 are shrunk by isotropic etch, widening the gaps between the features. In an embodiment, the features are shrunk to a width of approximately F/2.

Figure 8:
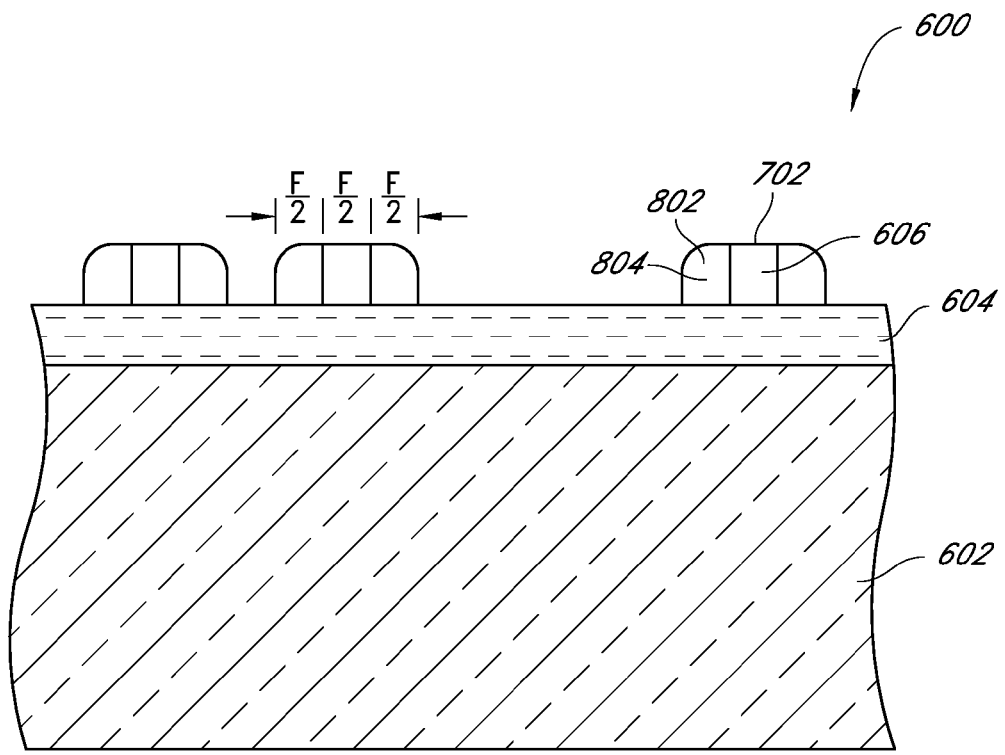
FIG. 8 illustrates a cross-sectional view taken along line A-A of an embodiment of the device of FIG. 7 after depositing spacers.

FIG. 8 illustrates a cross-sectional view taken along line A-A of an embodiment of the device of FIG. 7 after depositing spacers 802. In an embodiment, a layer of spacer material 804 is formed over the lines 702 of material 606 and the exposed hardmask 604. Preferably, the spacer material 602 can be selectively etched with respect to the hardmask 604, the silicon 602, and the material 606, and the hardmask 604, the silicon 602, and the material 606 can each be selectively etched with respect to the spacer material 804. In an embodiment, the layer of spacer material 804 comprises for example, TEOS having a thickness preferably within the range of about 0.25*F to about 0.5*F Å, and more preferably within the range of about 100 Å to about 600 Å. The material 804 can be deposited using any suitable deposition process, such as, for example, chemical vapor deposition (CVD) or physical vapor deposition (PVD).

In an embodiment, an anisotropic etch preferentially removes horizontal surfaces and patterns the spacer material 804 into the spacers 802 in a well-known spacer etch process. The spacers 802 form along the vertical sides of the lines 702, and have a width preferably about F/2.

Figure 9:
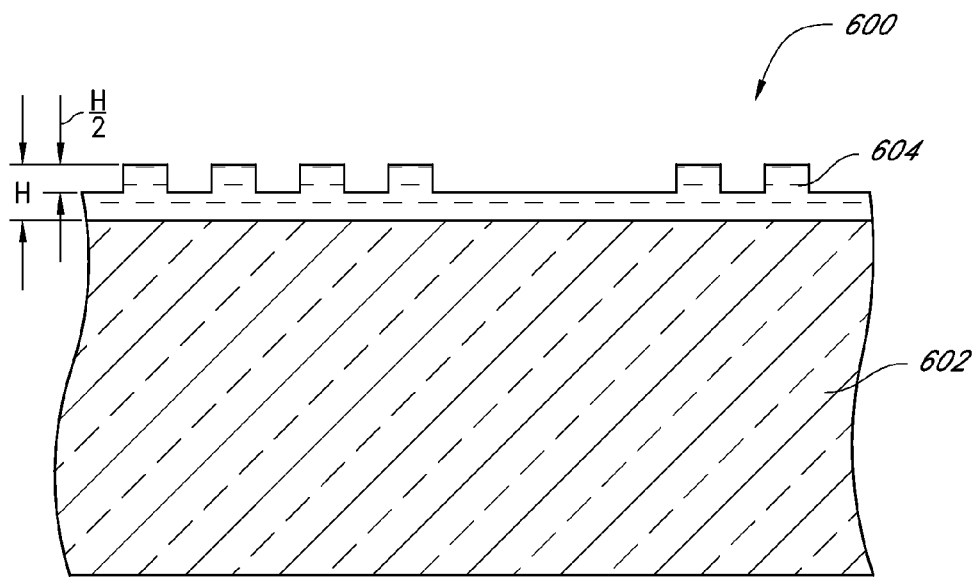
FIG. 9 illustrates a cross-sectional view taken along line A-A of an embodiment of the device of FIG. 8 after removing the lines and transferring the spacer pattern to the hardmask.

FIG. 9 illustrates the cross-sectional view taken along line A-A of an embodiment of the semiconductor device 600 of FIG. 8 after removing lines 702 of material 606 and transferring the spacer pattern of the spacers 802 to the hardmask 604.

In an embodiment, the material 606 is removed using a process such as, for example, ion milling, reactive ion etching (RIE), or chemical etching.

After removing the material 606, the spacer pattern is transferred to the hardmask 604. In an embodiment, the areas of the hardmask 604 not covered by the spacers 802 are etched using a process, such as, for example, ion milling, reactive ion etching (RIE), or chemical etching.

In an embodiment, the thickness H of the hardmask 604 outside the spacers 802 is approximately reduced to half of the original thickness H of the hardmask 604 in the etching process. The thickness H of the hardmask 604 protected by the spacers 802 is approximately unchanged.

FIG. 9 further illustrates the device 600 of FIG. 9 after the spacers 802 are removed. In an embodiment, the spacers 802 are removed using a process, such as, for example, ion milling, reactive ion etching (RIE), or chemical etching.

Figure 10:
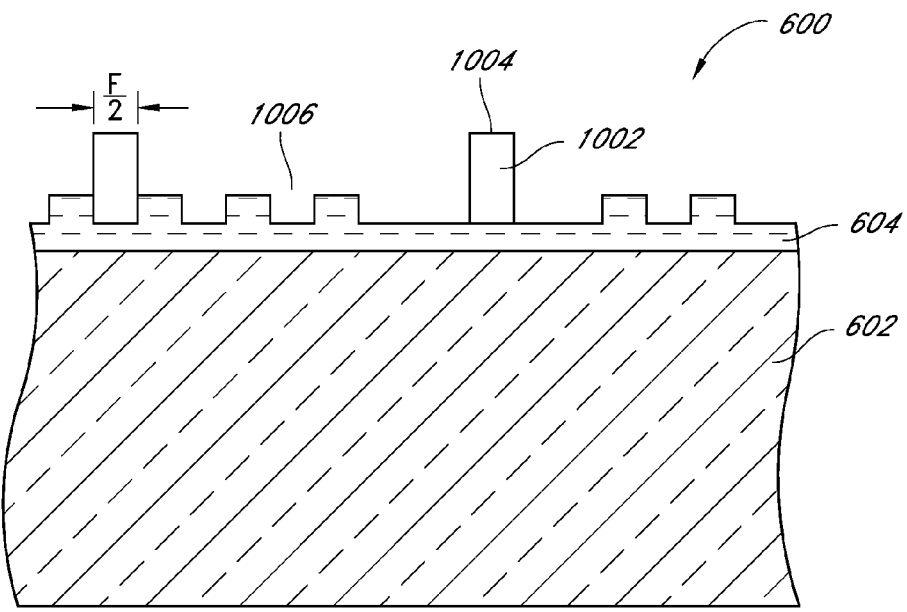
FIG. 10 illustrates a cross-sectional view taken along line A-A of an embodiment of the device of FIG. 9 after printing, shrinking, and etching the pattern from the mask of FIG. 4.

FIG. 10 illustrates the cross-sectional view taken along line A-A of an embodiment of the semiconductor device 600 of FIG. 9 after depositing a layer of a material 1002 over the etched hardmask 604 of FIG. 9. Preferably, the material 1002 can be etched selectively with respect to the hardmask 604 and the silicon 602, and the hardmask 604 and the silicon 602 can be selectively etched with respect to the material 1002. In an embodiment, the material 1002 can comprise a material such as, for example, α-carbon, TEOS, or Nitride, having a thickness preferably within the range of about 500 Å to about 3,000 Å and more, preferably within the range of about 1,000 Å to about 1500 Å. The material 1002 can be deposited using any suitable deposition process, such as, for example, chemical vapor deposition (CVD) or physical vapor deposition (PVD).

In an embodiment, the material 1002 is the same as the material 606, and the layer of the material 1002 is a second layer of the material 606.

FIG. 10 further illustrates applying the photo mask 400 (FIG. 4) and patterning the layer of the material 1002. The material 1002 can be patterned using well-known photolithography and etching techniques. For example, in some embodiments, photoresist is deposited as a blanket layer over the device 600 and exposed to radiation through a reticle. Following this exposure, the photoresist film is developed to form the photoresist mask 400 (FIG. 4) on the surface of the material 1002, and the material 1002 is etched through the mask 400 to expose the hardmask 604 of the device 600 in gaps 1006. In some embodiments, the material 1002 is etched using a process such as, for example, ion milling, reactive ion etching (RIE), or chemical etching.

As illustrated in FIG. 10, the material 1002 remains over areas of the hardmask 604 where the mask 400 forms lines 1004. The material 1002 is removed, however, from the areas over the hardmask 604 where the mask 400 forms the gaps 1006. In the illustrated embodiment, features of the material 1002 or the photo mask 400 are shrunk by isotropic etch, widening the gaps between the features. In an embodiment, the features are shrunk to a width of approximately F/2.

Figure 11:
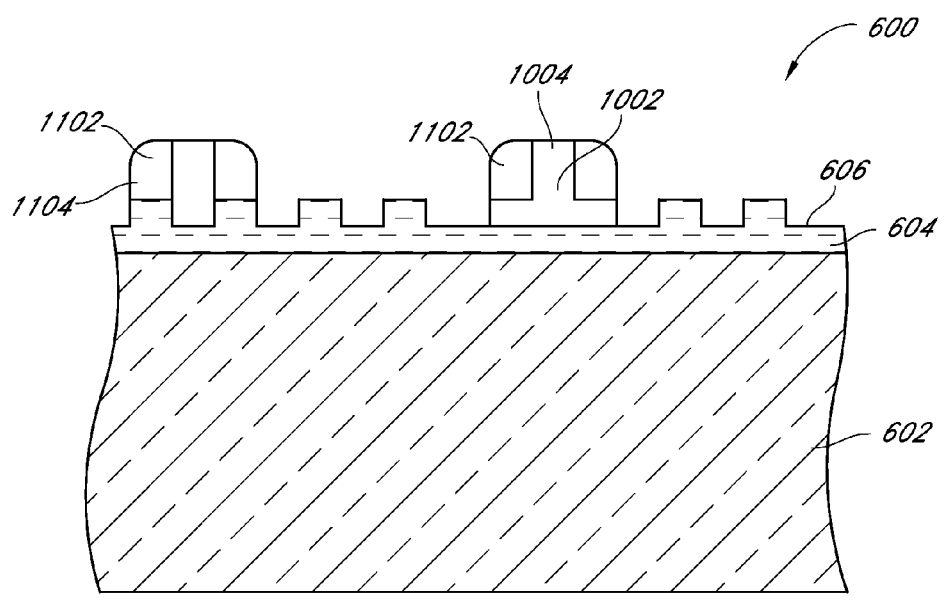
FIG. 11 illustrates a cross-sectional view taken along line A-A of an embodiment of the device of FIG. 10 after depositing spacers.

FIG. 11 illustrates the cross-sectional view taken along line A-A of an embodiment of the device 600 of FIG. 10 after depositing spacers 1102 outside the lines 1004. In an embodiment, a layer of spacer material 1104 is formed over the lines 1004 of material 1002 and the exposed hardmask 604. Preferably, the spacer material 1104 can be selectively etched with respect to the hardmask 604, the silicon 602, and the material 1002, and the hardmask 604, the silicon 602, and the material 1002 can each be selectively etched with respect to the spacer material 1104. In an embodiment, the layer of spacer material 1104 comprises a material, such as, for example, TEOS having a thickness preferably within the range of about 0.25*F to about 0.5*F, and more preferably within the range of about 100 Å to about 500 Å. The material 1104 can be deposited using any suitable deposition process, such as, for example, chemical vapor deposition (CVD) or physical vapor deposition (PVD). In an embodiment, the spacer material 1104 is the same as the spacer material 804.

In an embodiment, an anisotropic etch preferentially removes horizontal surfaces and patterns the spacer material 1104 into the spacers 1102 in a well-known spacer etch process. The spacers 1102 form along the vertical sides of the lines 1004, and have a width preferably about F/2.

Figure 12:
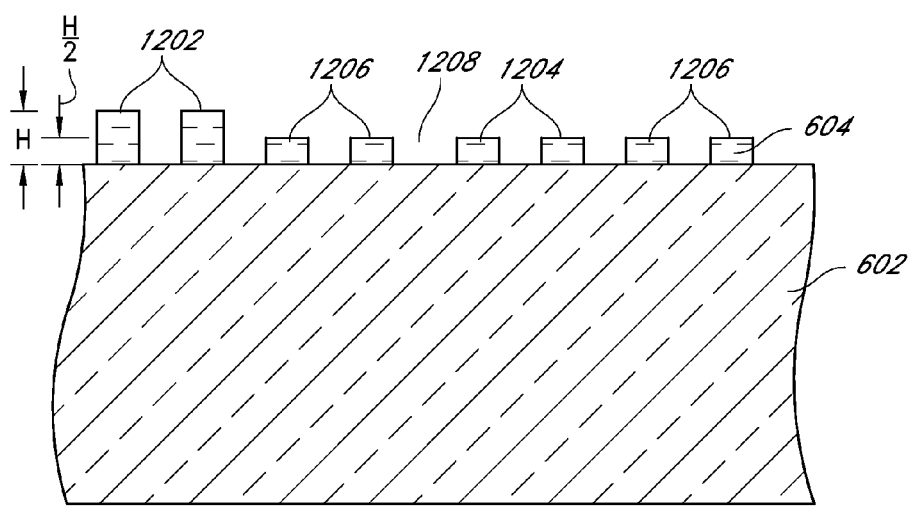
FIG. 12 illustrates a cross-sectional view taken along line A-A of an embodiment of the device of FIG. 11 after removing the lines and transferring the spacer pattern to the hardmask.

FIG. 12 illustrates a cross-sectional view taken along line A-A of an embodiment of the device of FIG. 11 after removing the lines 1004 of material 1002 and transferring the spacer pattern from the spacers 1102 to the hardmask 604. In an embodiment, the material 1002 is removed using a process such as, for example, ion milling, reactive ion etching (RIE), or chemical etching.

After removing the material 1002, the spacer pattern is transferred to the hardmask 604. In an embodiment, the areas of the hardmask 604 not covered by the spacers 1102 are etched using a process, such as, for example, ion milling, reactive ion etching (RIE), or chemical etching.

In an embodiment, the thickness H of the hardmask 604 outside the spacers 1102 is reduced by approximately half of the original thickness H of the hardmask 604 in the etching process. The thickness of the hardmask 604 protected by the spacers 1102 is approximately unchanged.

FIG. 12 further illustrates the device 600 of FIG. 11 after the spacers 1102 are removed. In an embodiment, the spacers 1102 are etched using a process, such as, for example, ion milling, reactive ion etching (RIE), or chemical etching.

FIG. 12 illustrates the patterned hardmask layer 604 formed from the masks 300, 400. The patterned hardmask layer 604 of FIG. 12 comprises hardmask pillars 1202, 1204, 1206, and gaps 1208. The thickness of the hardmask 604 where the spacers 1102 and 802 vertically align is approximately unchanged from the original thickness. H of the layer of hardmask 604, as illustrated by hardmask pillars 1202. Where the spacers 1102 vertically align with the gaps 704 from the mask 300, the thickness of the hardmask 604 is approximately half of the original thickness H, as illustrated by half-height hardmask pillars 1204. Similarly, the thickness of the hardmask 604, where the spacers 802 vertically align with the gaps 1006 from the mask 400, is approximately half of the original thickness H, as illustrated by half-height hardmask pillars 1206. Further, the hardmask 604 is removed from the areas of the semiconductor 600 where no spacers 802, 1102 were formed, as illustrated by gaps 1208.

The patterned hardmask 604 of FIG. 12 comprises a half pitched pattern which can be used to create an interconnect layer on the semiconductor device 600. The patterned hardmask 604 was generated from two normal pitch masks 300, 400, which in turn were created from the half pitched interconnect layout 100 comprising random shapes 102.

Figure 13:
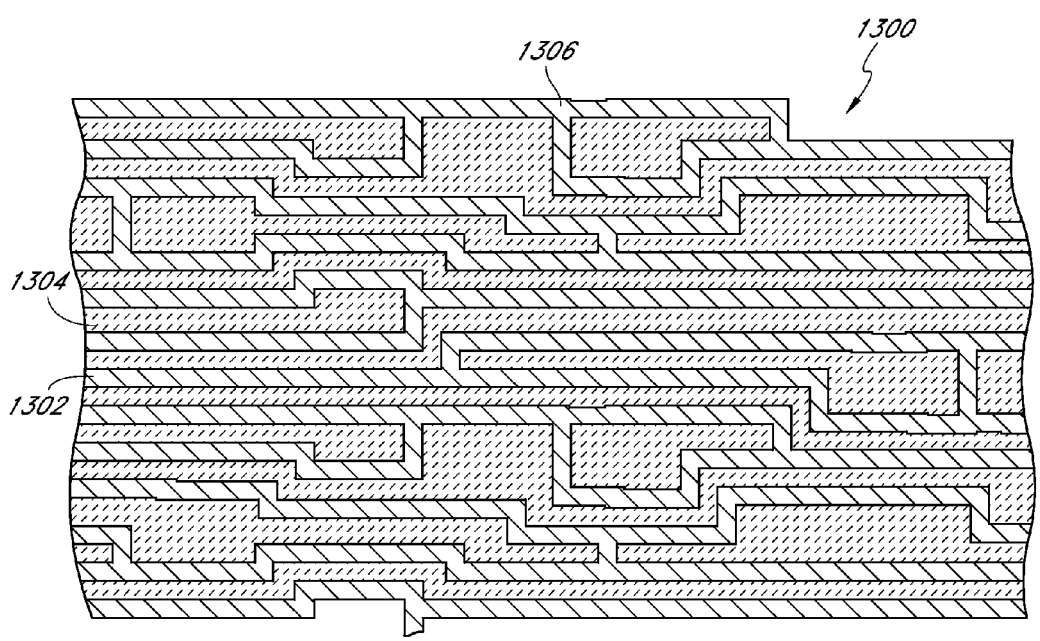
FIG. 13 illustrates a top plan view of an embodiment of an interconnect layer produced from the patterned hardmask layer of FIG. 12.

FIG. 13 illustrates a top plan view of an embodiment of an interconnect layer 1300 produced from the patterned hardmask 604 of FIG. 12. The interconnect layer 1300 comprises non-conductor areas 1302 and conductor areas 1304. The non-conductor areas further comprise connection nodes 1306 where two or more non-conductor areas 1302 intersect. In an embodiment, the interconnect layer 1300 has constant spacing between the nodes 1306.

In an embodiment, the hardmask pillars 1202, 1204, 1206 are replaced with a non-conductive material in later processing steps. The spaces between the hardmask pillars 1202, 1204, 1206 can be filled with a conductive material, such as copper, to form the conductive areas of the semiconductor in later processing steps.

In other embodiments, the spaces between the hardmask pillars 1202, 1204, 1206 can be filled with a conductive material, such as aluminum, to form the conductive areas of the semiconductor in later processing steps. The hardmask pillars 1202, 1204, 1206 are removed in later processing steps and the gaps formed by the removal of the hardmask pillars 1202, 1204, 1206 isolate the conductive areas.

Figure 14:
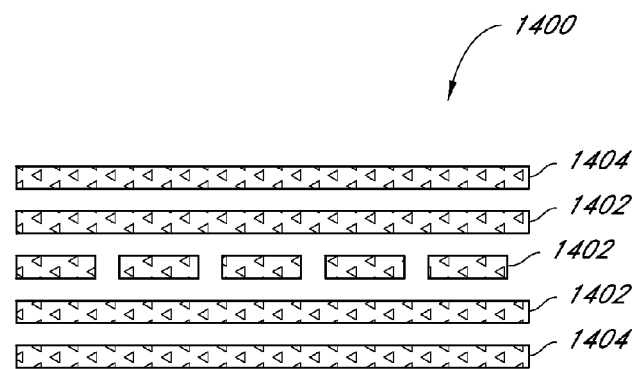
FIG. 14 illustrates a top plan view of an exemplary embodiment of a half pitched interconnect layout comprising semi-random shapes.

FIG. 14 illustrates a top plan view of an exemplary embodiment of a half pitched interconnect layout 1400 comprising semi-random shapes 1402 and peripheral shapes 1404. The half pitched interconnect layout 1400 cannot be used directly to form a mask used in a photolithographic process to create an interconnect layer because the pitch is smaller than the minimum printable feature of a mask.

In order to print the features of the interconnect layout 1400 photolithographically on a semiconductor device, two normal pitched masks are generated from the interconnect layout 1400.

Figure 15:
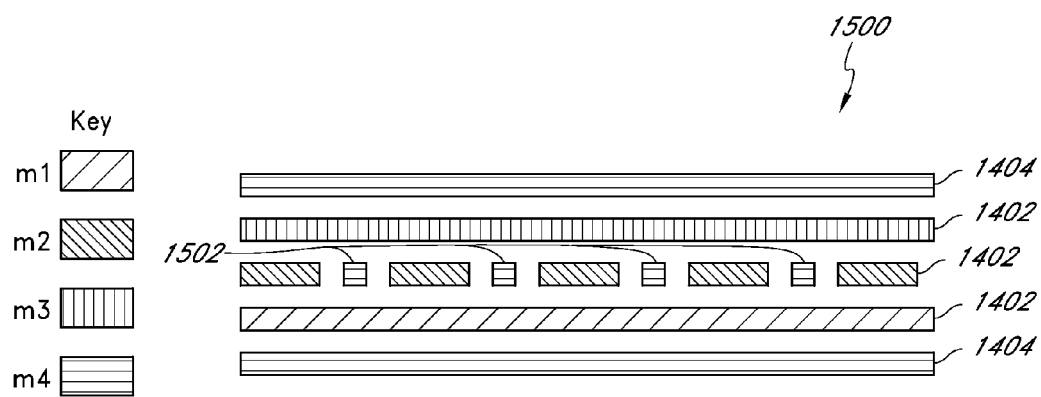
FIG. 15 illustrates a top plan view of an embodiment of the interconnect layout of FIG. 14 partitioned into four designations, m1, m2, m3, and m4, where dummy m4 shapes are introduced to satisfy the condition that no two shapes of the same designations are next to each other.

FIG. 15 illustrates a top plan view of an embodiment of an interconnect layout 1500 where the semi-random shapes 1402 in the layout 1400 of FIG. 14 are labeled as either m1, m2, or m3. The peripheral shapes 1404 are labeled as m4. FIG. 15 further comprises dummy shapes or separators 1502, which are labeled as m4. In an embodiment, the semi-random shapes 1402 are defined as conductor areas and the peripheral shapes and dummy shapes 1404 are defined as non-conductor areas.

In the embodiment illustrated in FIG. 15, the shapes 1402 designated as m1 are indicated by a right slanted 45° hatching. The shapes 1402 designated as m2 are indicated by a left slanted 45° hatching, and the shapes 1402 designated as m3 are indicated by vertical lines. The peripheral shapes 1404 and the dummy shapes 1502 designated as m4 are indicated by horizontal lines.

When designating the shapes 1402, 1404, in an embodiment, the peripheral shapes 1404 assigned as m4. The shapes 1402 are designated as m1, m2, or m3 such that no shapes 1402 of the same designation m1, m2, m3, are next to each other. If this is not possible, as is the case with the layout 1400, dummy shapes 1502, designated as m4, are introduced into the layout 1400 to satisfy the requirement that no shapes 1402 of the same designation are next to each other.

In the embodiment illustrated in FIG. 15, dummy shapes 1502 are added to the layout 1500 between the semi-random shapes 1402 designated as m2 to prevent two of the shapes designated as m2 from being directly beside one another. In an embodiment, the layout 1500 is larger than the layout 1400 as a result of adding the dummy shapes 1502.

Figure 16:
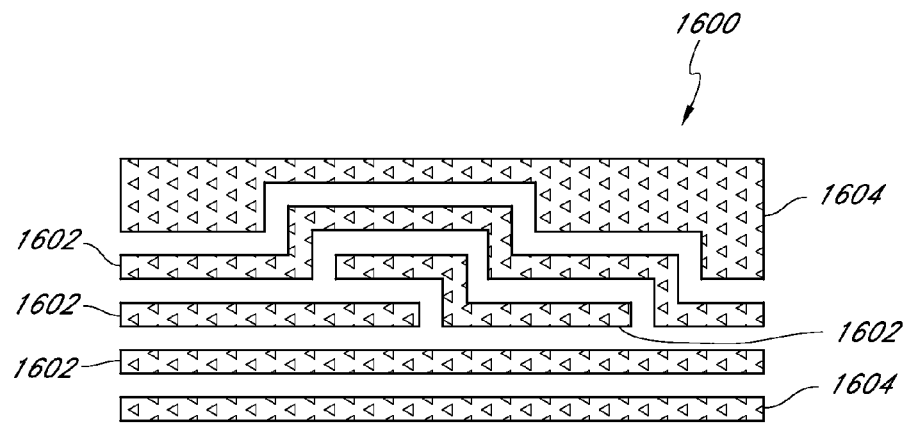
FIG. 16 illustrates a top plan view of another exemplary embodiment of a half pitched interconnect layout comprising semi-random shapes.

FIG. 16 illustrates a top plan view of another exemplary embodiment of a half pitched interconnect layout 1600 comprising semi-random shapes 1602 and peripheral shapes 1604.

Figure 17:
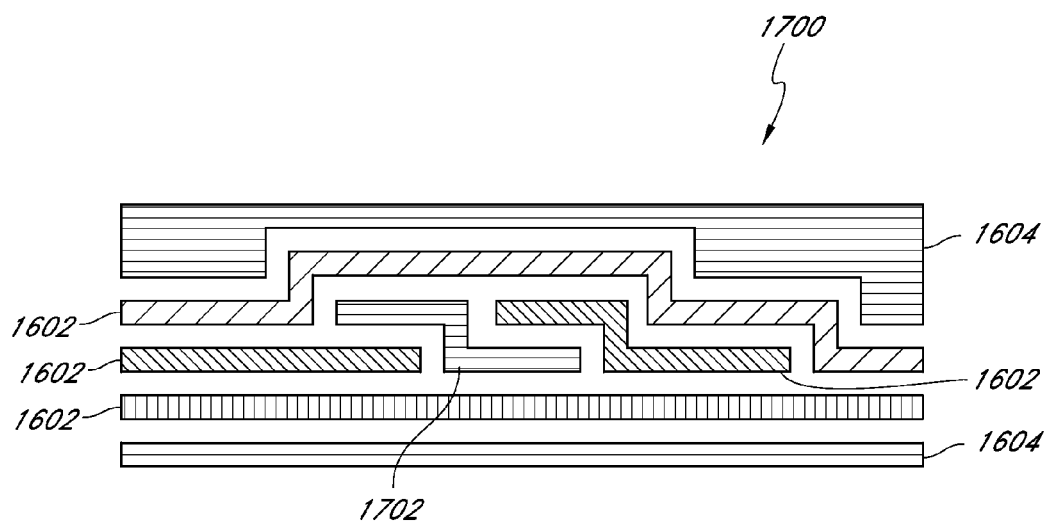
FIG. 17 illustrates a top plan view of an embodiment of the interconnect layout of FIG. 16 partitioned into four designations, m1, m2, m3, and m4, where dummy m4 shapes are introduced to satisfy the condition that no two shapes of the same designations are next to each other.

FIG. 17 illustrates a top plan view of an embodiment of an interconnect layout 1700 where the semi-random shapes 1602 in the layout 1600 of FIG. 16 are labeled as either m1, m2, or m3. As described above with respect to FIGS. 14 and 15, a dummy shape 1702 is introduced to satisfy the condition that no two shapes 1602 of the same designations m1, m2, m3 are next to each other. The peripheral shapes 1604 and the dummy shape 1702 are designated as m4, which is defined as a non-conductor.

In the embodiment illustrated in FIG. 17, the shapes 1602 designated as m1 are indicated by a right slanted 45° hatching. The shapes 1602 designated as m2 are indicated by a left slanted 45° hatching, and the shapes 1602 designated as m3 are indicated by vertical lines. The peripheral shapes 1604 and the dummy shape 1702 designated as m4 are indicated by horizontal lines. Dummy shape 1702 is added to the layout 1600 between the semi-random shapes 1602 designated as m2 to prevent two of the shapes of the same designation from being directly beside one another.

Figure 18:
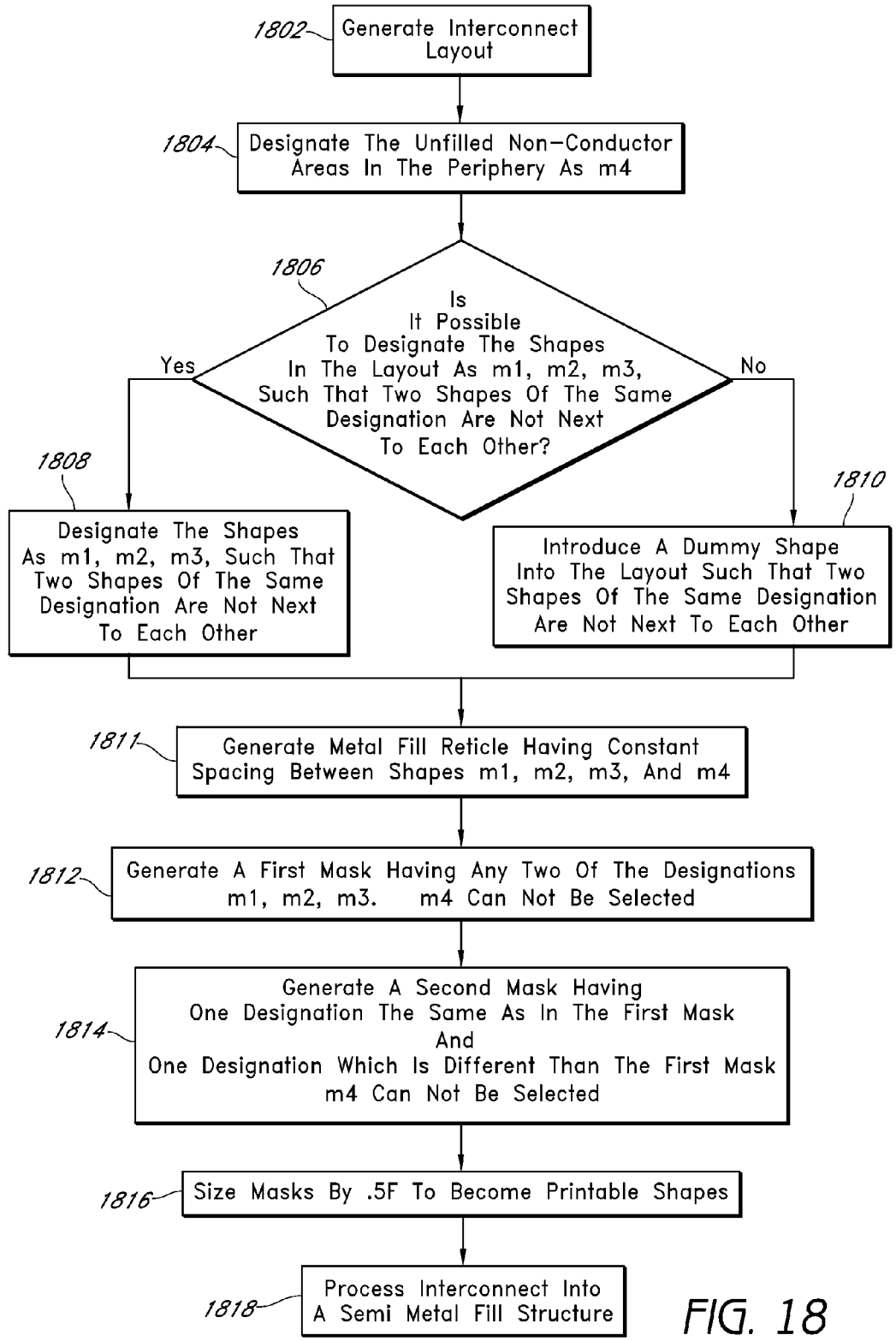
FIG. 18 illustrates a flow chart of an embodiment of the process to produce two standard pitch masks from a half pitched layout comprising semi-random shapes and non-conductor peripheral areas.

FIG. 18 illustrates a flow chart of an embodiment of a process 1800 to produce two standard pitch masks from the half pitched layout 1500, 1700 comprising semi-random shapes 1402, 1602, non-conductor peripheral areas 1404, 1604, and added dummy shapes 1502, 1702, respectively. In an embodiment, the process 1800 is alignment sensitive and the alignment error should be less than 0.25 F.

In block 1802, the half pitched interconnect layout 1400, 1600 is generated. In an embodiment, the layout 1400, 1600 is a metallization layout with constant spacing between conductive nodes and has non-conductive, non-fill peripheral areas.

In block 1804, the non-fill, non-conductive areas in the periphery 1404, 1604 are designated as m4.

If, in block 1806, it is possible to designate the shapes 1402, 1602 as m1, m2, or m3 such that two shapes of the same designation are not adjacent, then the process 1800 moves to block 1808.

In block 1808, the shapes 1402, 1602 are designated m1, m2, m3 that two shapes of the same designation are not next to one another.

If, in block 1806, it is not possible to designate the shapes 1402, 1602 as m1, m2, or m3 such that two shapes of the same designation are not adjacent, then the process 1800 moves to block 1810.

In block 1810, dummy shapes 1502, 1702 are introduced into the layout 1500, 1700 to satisfy the condition that two shapes of the same designation are next to one another. The dummy shapes 1502, 1702 are designated as m4.

As indicated in block 1811, the layout, in an embodiment, is a metal fill reticle having constant spacing between the shapes m1, m2, m3, and m4. This allows double pitching.

In block 1812, the layout of a first mask 1820 (not shown) is generated using shapes 1402, 1602 having any two of the three designations, m1, m2, m3. Shapes 1404, 1502, 1604, 1702 having the designation m4 cannot be selected. In the examples illustrated in FIGS. 15 and 17, shapes 1402, 1602 having combinations of two of the designations m1, m2, m3 include shapes m1 and m2, shapes m2 and m3, or shapes m1 and m3.

In block 1814, the layout of a second mask 1822 (not shown) is generated using shapes 1402, 1602 having one of the designations chosen in the first mask and one of the designations not chosen in the first mask. Shapes 1404, 1502, 1604, 1702 having the designation m4 cannot be selected. For example, if shapes having the designations m1 and m2 are selected for the first mask 1820, either shapes having the designations m1 and m3, or m2 and m3 can be selected for the second mask 1822.

In block 1816, in order to be used in the photolithographic process, the shapes 1402, 1404, 1502, 1602, 1604, 1702 in the masks 1820, 1822 are sized by 0.5 F to become printable shapes.

The layouts for the masks 1820, 1822 are each processed into a metal fill structure in block 1818. In an embodiment, the metal fill structure is a semi-metal fill structure.

Figure 19:
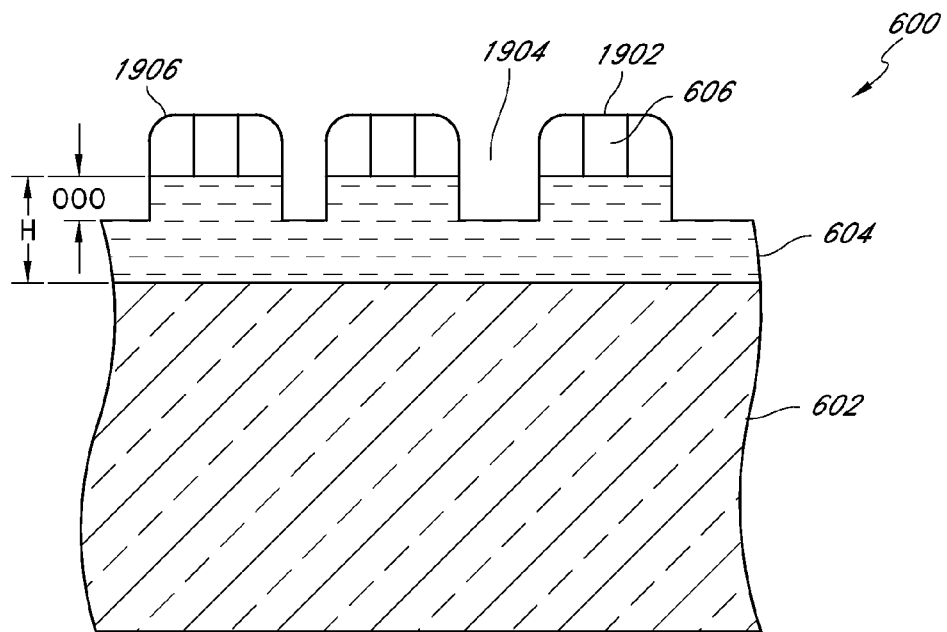
FIG. 19 illustrates a cross-sectional view taken along line A-A of another embodiment of the device of FIG. 6 after from printing, shrinking, and etching a first mask generated from the layout of FIG. 15 or 17, depositing spacers, and etching the hardmask outside the spacer/line pattern by a first amount.

FIG. 19 illustrates a cross-sectional view taken along line A-A of another embodiment of the semiconductor device 600 of FIG. 6 after printing, shrinking, and etching the first mask 1820, depositing spacers 1906, and etching the hardmask 604 outside the spacer/line pattern by a first amount ooo. The first photo mask 1820 is applied to the device 600 and the material 606 is patterned using well-known photolithography and etching techniques, examples of which are described above.

As illustrated in FIG. 19, the material 606 remains over areas of the hardmask 604 where the first mask 1820 forms lines 1902. The material 606 is removed, however, from the area over the hardmask 604 where the first mask 1820 forms gaps 1904. In the illustrated embodiment, features of the material 606 or the first photo mask 1820 are shrunk by isotopic etch, widening the gaps between the features. In an embodiment, the features are shrunk to a width of approximately F/2.

Also illustrated in FIG. 19, spacers 1906 are formed along the vertical sides of the lines 1902 from a layer of spacer material 1908 and have a width preferably of about F/2. The spacer material 1908 is deposited and the spacers 1906 are etched using well-known deposition and etching processes, examples of which are described above. Preferably, the material 1908 can be selectively etched with respect to the material 606, the silicon 602, and the hardmask 604, and the material 606, the silicon 602, and the hardmask 604 can be selectively etched with respect to the material 1908.

Further illustrated in FIG. 19, the areas of the hardmask 604 not covered by the spacers 1906 and the lines 1902 are the areas of the hardmask 604 outside the spacer/line pattern of the first mask 1820 and are etched using a process, such as, for example, ion milling, reactive ion etching (RIE), or chemical etching, as describe above. In an embodiment, the thickness H of the hardmask 604 not covered by the spacers 1906 and the lines 1902 is approximately reduced by the first amount ooo. The thickness H of the hardmask 604 covered by the spacers 1906 and the lines 1902 is approximately unchanged.

Figure 20:
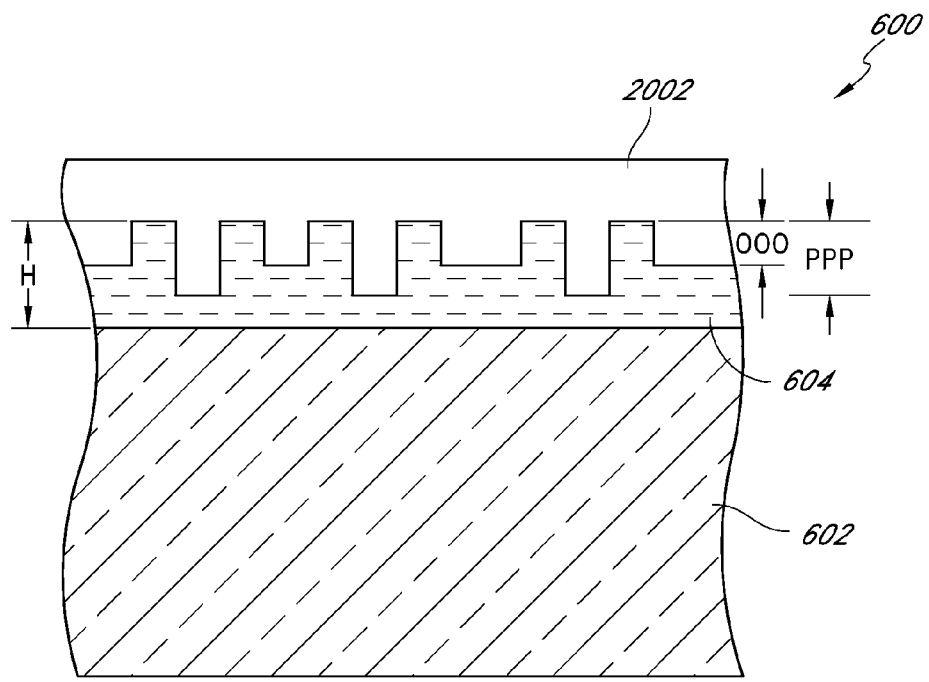
FIG. 20 illustrates a cross-sectional view taken along line A-A of an embodiment of the device of FIG. 19 after removing the line material, etching the hardmask inside the spacers by a second amount, removing the spacers, and depositing an additional semiconductor processing layer.

FIG. 20 illustrates a cross-sectional view taken along line A-A of an embodiment of the device 600 of FIG. 19 after removing the material 606 from the lines 1902, etching the hardmask 604 previously covered by the lines 1902 by a second amount ppp, removing the spacers 1906, and depositing an additional semiconductor processing layer 2002. The material 606 in the lines 1902 is removed using at least one suitable etching process. Suitable etching processes, examples of which are described above, are well known to those skilled in the art of semiconductor processing.

As illustrated in FIG. 20, the hardmask 604 in the areas previously covered by the lines 1902 is the area of the hardmask 604 inside the spacers 1906 and is etched by a second amount ppp using at least one suitable etching process. In an embodiment, an over etch of the second amount ppp reduces the thickness of the hardmask 604 in the areas previously covered by the lines 1902 by the second amount ppp.

Also illustrated in FIG. 20, the spacers 1906 are removed using at least one suitable etching process. Suitable etching processes, examples of which are described above, are well known to those skilled in the art of semiconductor processing.

Further illustrated in FIG. 20, a layer of material 2002 is deposited over the patterned hardmask 604. The material 2002 is deposited using well-known deposition processes, examples of which are described above. Preferably, the material 2002 can be selectively etched with respect to the hardmask 604, and the silicon 602, and the hardmask 604 and the silicon 602 can be selectively etched with respect to the material 2002.

Figure 21:
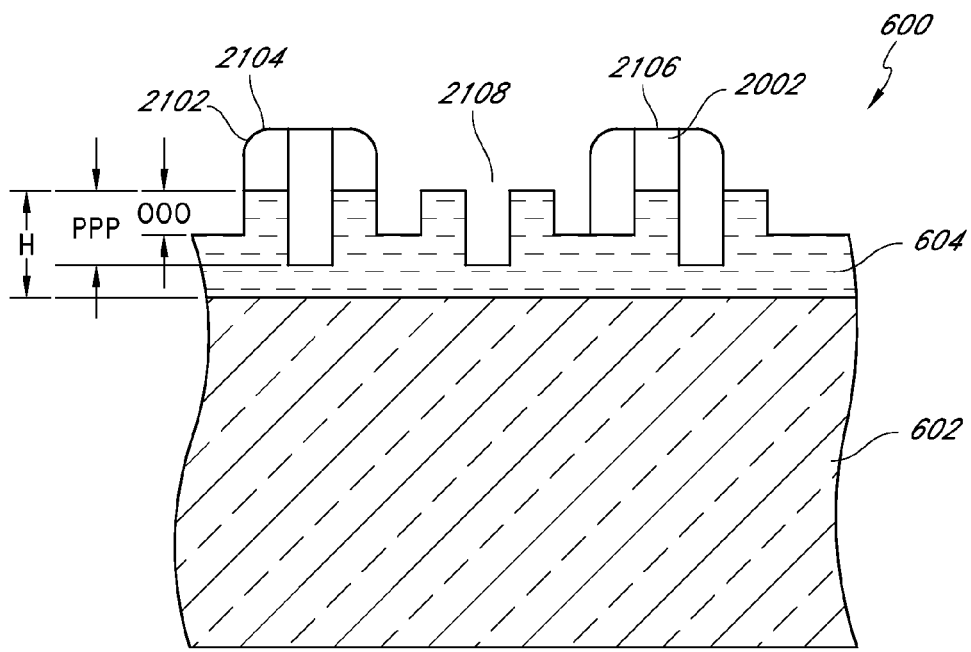
FIG. 21 illustrates a cross-sectional view taken along line A-A of an embodiment of the device of FIG. 20 after printing, shrinking, and etching a second mask generated from the layout of FIG. 15 or 17, depositing spacers, and etching the hardmask outside the spacer/line pattern by the first amount.

FIG. 21 illustrates a cross-sectional view taken along line A-A of an embodiment of the device 600 of FIG. 20 after printing, shrinking, and etching the second mask 1822, depositing spacer material 2102, and forming spacers 2104. The second photo mask 1822 is applied to the device 600 and the material 2002 is patterned using well-known photolithography and etching techniques, examples of which are described above.

As illustrated in FIG. 21, the material 2002 remains over areas of the hardmask 604 where the second mask 1822 forms lines 2106. The material 2002 is removed, however, from the area over the hardmask 604 where the second mask 1822 forms gaps 2108. In the illustrated embodiment, features of the material 2002 or the second photo mask 1822 are shrunk by isotopic etch, widening the gaps between the features. In an embodiment, the features are shrunk to a width of approximately F/2.

Also illustrated in FIG. 21, spacers 2104 are formed along the vertical sides of the lines 2106 from the layer of spacer material 2102 and have preferably have a width of about F/2. The spacer material 2102 is deposited and the spacers 2104 are etched using well-known deposition and etching processes, examples of which are described above. Preferably, the material 2102 can be selectively etched with respect to the material 2002, the silicon 602, and the hardmask 604, and the material 2002, the silicon 602, and the hardmask 604 can be selectively etched with respect to the material 2102.

Figure 22:
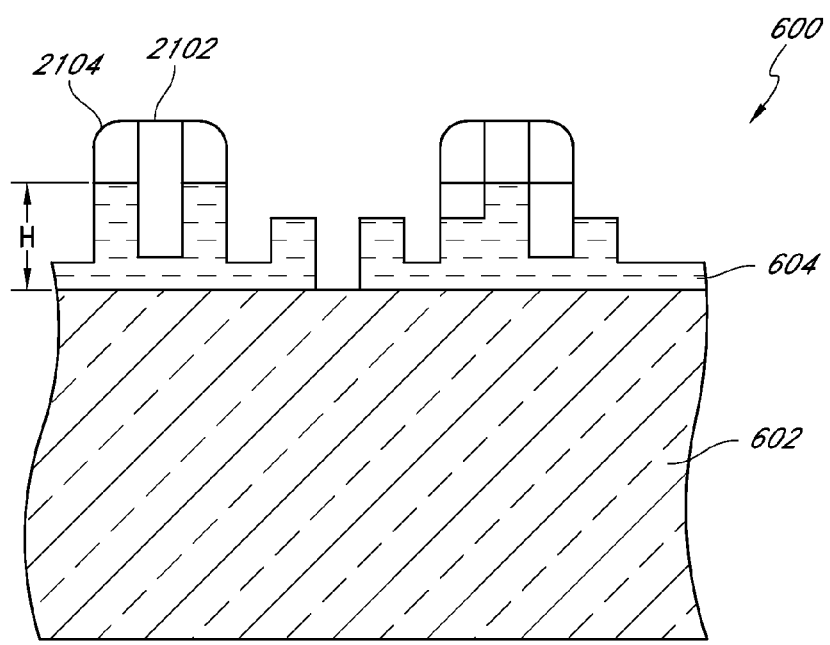
FIG. 22 illustrates a cross-sectional view taken along line A-A of an embodiment of the device of FIG. 21 after removing the lines, and etching the hardmask inside the spacer pattern by the second amount.

FIG. 22 illustrates a cross-sectional view taken along line A-A of an embodiment of the device 600 of FIG. 21 after etching the hardmask 604 outside the spacer/line pattern by a third amount rrr. The area of the hardmask 604 not covered by the lines 2106 and the spacers 2104 is the area of the hardmask 604 outside the spacer/line pattern of the second mask 1822. In the illustrated embodiment, the third amount rrr is approximately the same as the first amount ooo, and will be indicated as such. In other embodiments, the third amount rrr is not the same as the first amount ooo.

Further illustrated in FIG. 22, the areas of the hardmask 604 not covered by the spacers 2104 and the lines 2106 are etched using a process, such as, for example, ion milling, reactive ion etching (REI), or chemical etching, as describe above. In an embodiment, the thickness of the hardmask 604 not covered by the spacers 2104 and the lines 2106 is approximately reduced by the first amount ooo. The thickness of the hardmask 604 covered by the spacers 2104 and the lines 2106 is approximately unchanged from that of FIG. 21.

Figure 23:
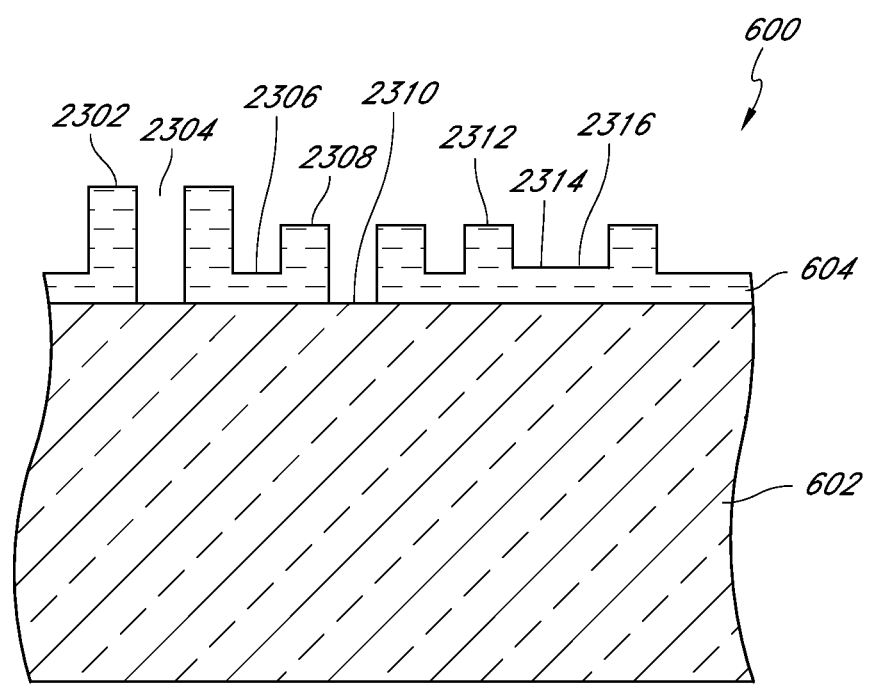
FIG. 23 illustrates a cross-sectional view taken along line A-A of an embodiment of the device of FIG. 22 after removing the spacers and any material remaining from the additional processing layers.

FIG. 23 illustrates a cross-sectional view taken along line A-A of an embodiment of the device 600 of FIG. 22 after removing the material 2002 from the lines 2106, etching the hardmask 604 previously covered by the lines 2106 by a fourth amount sss, and removing the spacers 2104. The area of the hardmask 604 previously covered by the lines 2106 is the area of the hardmask 604 inside the spacers 2104. In the illustrated embodiment, the fourth amount sss is approximately the same as the second amount ppp, and will be indicated as such. In other embodiments, the fourth amount sss is not the same as the second amount ppp.

The material 2002 in the lines 2106 is removed using at least one suitable etching process. Suitable etching processes, examples of which are described above, are well known to those skilled in the art of semiconductor processing.

As illustrated in FIG. 23, the hardmask 604 in the areas previously covered by the lines 2106 is etched by a second amount ppp using at least one suitable etching process. In an embodiment, an over etch of the second amount ppp reduces the thickness of the hardmask 604 in the areas previously covered by the lines 2106 by the second amount ppp.

Also illustrated in FIG. 23, the spacers 2104 are removed using at least one suitable etching process. Suitable etching processes, examples of which are described above, are well known to those skilled in the art of semiconductor processing.

FIG. 23 illustrates the patterned hardmask layer 604 formed from the masks 1820, 1822. The patterned hardmask layer 604 of FIG. 23 comprises hardmask pillars 2302, 2306, 2308, 2312, 2314, 2316, and gaps 2304, 2310. The thickness of the hardmask 604 where the spacers 1906, 2104 vertically align is approximately unchanged from the original thickness H of the layer of hardmask 604, as illustrated by hardmask pillars 2302.

The hardmask is removed where lines 1902, 2106 from the masks 1820, 1822 vertically align, as illustrated by the gap 2304. The amount of the hardmask 604 removed at the gap 3204 can be represented by H-ppp-ppp. In the illustrated embodiment, H-ppp-ppp<0, and the hardmask thickness is approximately zero.

The thickness of the hardmask 604 where the area outside the spacer/line pattern of the first mask 1820 vertically aligns with the area outside the spacer line pattern of the second mask 1822 can be represented by H-ooo-ooo, and is illustrated by the pillar 2306.

The thickness of the hardmask 604 where the area outside the spacer/line pattern of the second mask 1822 vertically aligns with the spacer 1906 can be represented by H-ooo, and is illustrated by pillar 2308.

The hardmask 604 is removed where the area outside the spacer/line pattern of the second mask 1822 and the line 1902 vertically align. The amount of the hardmask 604 removed can be represented as H-ooo-ppp, and is illustrated by gap 2310. In the illustrated embodiment, H-ooo-ppp<0, and the hardmask thickness is approximately zero.

The thickness of the hardmask 604 where the area outside the spacer/line pattern of the first mask 1820 vertically aligns with the spacer 2104 can be represented as H-ooo, and is illustrated by the pillar 2312.

The thickness of the hardmask 604 where the line 2106 vertically aligns with the spacer 1906 can be represented as H-ppp, and is illustrated by the pillar 2314.

The thickness of the hardmask 604 where the spacer 2104 vertically aligns with the line 1902 can be represented as H-ppp, and is illustrated by the pillar 2316.

The thickness of the hardmask 604 where the area outside the spacer/line pattern of the first mask 1820 vertically aligns with the line 2106 can be represented as H-ooo-ppp (not shown). If H-ooo-ppp<0, then the thickness of the hardmask is approximately zero.

The patterned hardmask 604 of FIG. 23 comprises a half pitched pattern which can be used to create an interconnect layer on the semiconductor device 600. The patterned hardmask 604 was generated from two normal pitch masks 1820, 1822 which in turn were created from the half pitched interconnect layout 1500 or 1700 comprising semi-random shapes 1402, 1404, 1502, 1602, 1604, 1702 respectively.

FIG. 24 is a table having exemplary values for the thickness of the hardmask 604, the first etch amount ooo, and the second etch amount ppp, and illustrates how the thickness of the hardmask 604 and the first and second etch amounts ooo, ppp may control the formation of the interconnect mask in an embodiment. In the illustrated embodiment, the hardmask thickness is 5, the first etch amount is 2, and the second etch amount is 4. The entries in the table represent the thickness of the hardmask 604 after performing the process steps described in FIGS. 19-23 with the masks 1820, 1822 created from the interconnect layouts 1400, 1600. Positive table entries indicate an area of hardmask covering the semiconductor device 600. After forming an interconnect layer with the patterned hardmask 604 of FIG. 23, conductors form in these areas. Negative or zero table entries indicate areas where the hardmask 604 is removed. After forming an interconnect layer with the patterned hardmask of FIG. 23, nonconductors or insulators.

By choosing the thickness H of the hardmask 604, the first etch amount ooo, and the second etch amount ppp, the areas of hardmask 604 remaining on the semiconductor device 600, after performing the process steps described above with respect to FIGS. 19-23, can be selected.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions, and changes in the form of the methods and systems described herein may be made without departing from the spirit of the inventions. The accompanying claims and their equivalents are intended to cover such forms or modifications as would fall within the scope and spirit of the inventions.

What is claimed is:

1. A method of creating a half pitch interconnect from a half pitch interconnect layout comprising:
generating a half pitched interconnect layout comprising a plurality of shapes in the plane of the interconnect layout, wherein the plurality of shapes include a plurality of shape designations, each shape designation having different shapes and shapes of the same designation are not adjacent in the plane of the interconnect layout;
creating a first photo mask containing shapes having two or more of the plurality of shape designations;
creating a second photo mask containing shapes having one or more of the plurality of shape designations included in the first photo mask and one or more of the plurality of shape designations not included in the first photo mask, wherein the first and second photo masks are dimensioned so that the first and second photo masks generate a half pitch interconnect corresponding to the half pitch interconnect layout when the first and second photo masks are used in a patterning process.

2. The method of claim 1 further comprising sizing the first photo mask to create a first normal pitch photo mask and sizing the second photo mask to create a second normal pitch photo mask.

3. The method of claim 1 wherein the shapes are random shapes.

4. The method of claim 1 wherein the layout possesses substantially constant spacing between the plurality of shapes.

5. The method of claim 1 wherein the alignment error is less than about one-quarter pitch.

6. The method of claim 4 wherein the spacing comprises non-conductive areas having substantially constant spacing between a plurality of non-conductive connection nodes.

7. A method of creating a half pitch interconnect from a half pitch interconnect layout comprising:
generating an interconnect layout comprising a plurality of shapes in the plane of the interconnect layout, the plurality of shapes having a plurality of shape designations, wherein a shape designation comprises a periphery of the interconnect layout and each shape designation comprises different shapes;
introducing separators into the interconnect layout, wherein the separators are positioned within the interconnect layout such that shapes having the same designation are not adjacent in the plane of the interconnect layout;

creating a first photo mask containing shapes having two or more of the plurality of shape designations, the first photo mask not including the shape designation comprising the periphery of the interconnect layout;

creating a second photo mask containing shapes having one or more of the plurality of shape designations included in the first photo mask and one or more of the plurality of shape designations not included in the first photo mask, the second photo mask not having the shape designation comprising the periphery of the interconnect layout;

wherein the first and second photo masks are dimensioned so that the first and second photo masks generate a half pitch interconnect corresponding to the half pitch interconnect layout when the first and second photo masks are used in a patterning process.

8. The method of claim 7 wherein the interconnect layout is a half pitch interconnect layout comprising semi-random shapes and the periphery.

9. The method of claim 7 further comprising sizing the first photo mask to create a first normal pitch photo mask and sizing the second photo mask to create a second normal pitch photo mask.

10. The method of claim 7 wherein the periphery of the interconnect layout corresponds to a non-conductive area of the interconnect layout.

11. The method of claim 7 wherein the separators correspond to a non-conductive area of the interconnect layout.

12. The method of claim 7 wherein the interconnect layout comprises substantially constant spacing between the plurality of shapes.

13. A method of creating a half pitch interconnect from a half pitch interconnect layout, comprising:

generating an interconnect layout comprising a plurality of shapes in the plane of the interconnect layout, the plurality of shapes having a plurality of shape designations such that shapes of the same designation are not adjacent in the plane of the interconnect layout, wherein a shape designation comprises a periphery of the interconnect layout and each shape designation comprises different shapes;

creating a first photo mask containing shapes having two or more of the plurality of shape designations, the two or more shape designations not having the shape designation comprising the periphery of the interconnect layout;

creating a second photo mask containing shapes having one or more of the plurality of shape designations in the first photo mask and one or more of the plurality of shape designations not included in the first photo mask, the second photo mask not having a shape designation comprising the periphery of the interconnect layout;

wherein the first and second photo masks are dimensioned so that the first and second photo masks generate a half pitch interconnect corresponding to the half pitch interconnect layout when the first and second photo masks are used in a patterning process.

14. The method of claim 13 further comprising introducing separators into the interconnect layout such that shapes of the same designation are not adjacent, wherein the separators do not comprise a shape designation included in the first and second photo masks.

15. The method of claim 13 wherein the interconnect layout is a half pitch interconnect layout comprising semi-random shapes and the periphery.

16. The method of claim 13 further comprising sizing the first photo mask to create a first normal pitch photo mask and sizing the second photo mask to create a second normal pitch photo mask.

17. The method of claim 13 wherein the periphery of the interconnect layout corresponds to a non-conductive area of the interconnect layout.

18. The method of claim 13 wherein the separators correspond to a non-conductive area of the interconnect layout.

19. The method of claim 13 wherein the interconnect layout comprises substantially constant spacing between the plurality of shapes.

* * * * *